United States Patent
Park et al.

(10) Patent No.: US 11,270,987 B2
(45) Date of Patent: Mar. 8, 2022

(54) SEMICONDUCTOR DEVICES

(71) Applicant: Samsung Electronics Co., Ltd., Suwon-si (KR)

(72) Inventors: Hyun Mog Park, Seoul (KR); Sang Youn Jo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 21 days.

(21) Appl. No.: 16/994,207

(22) Filed: Aug. 14, 2020

(65) Prior Publication Data

US 2020/0381413 A1 Dec. 3, 2020

Related U.S. Application Data

(63) Continuation of application No. 16/414,083, filed on May 16, 2019, now Pat. No. 10,748,886.

(30) Foreign Application Priority Data

Oct. 1, 2018 (KR) .......................... 10-2018-0116806

(51) Int. Cl.
*H01L 27/11521* (2017.01)
*H01L 25/18* (2006.01)
(Continued)

(52) U.S. Cl.
CPC ............ *H01L 25/18* (2013.01); *H01L 23/528* (2013.01); *H01L 24/05* (2013.01); *H01L 24/08* (2013.01);
(Continued)

(58) Field of Classification Search
CPC ....... H01L 23/528; H01L 25/18; H01L 25/50; H01L 24/05; H01L 24/08;
(Continued)

(56) References Cited

U.S. PATENT DOCUMENTS

| 6,377,504 B1 | 4/2002 | Hilbert |
| 8,242,543 B2 | 8/2012 | Chandrasekaran et al. |

(Continued)

FOREIGN PATENT DOCUMENTS

| JP | 6127360 B2 | 5/2017 |
| KR | 10-2015-0048932 A | 5/2015 |
| KR | 10-2017-0090183 A | 8/2017 |

*Primary Examiner* — Nathan W Ha
(74) *Attorney, Agent, or Firm* — Muir Patent Law, PLLC

(57) ABSTRACT

A semiconductor device includes a first substrate structure including a first substrate, gate electrodes stacked on the first substrate, and extended by different lengths to provide contact regions, cell contact plugs connected to the gate electrodes in the contact regions, and first bonding pads disposed on the cell contact plugs to be electrically connected to the cell contact plugs, respectively, and a second substrate structure, connected to the first substrate structure on the first substrate structure, and including a second substrate, circuit elements disposed on the second substrate, and a second bonding pad bonded to the first bonding pads, wherein, the contact regions include first regions having a first width and second regions, of which at least a portion overlaps the first bonding pads, and which have a second width greater than the first width, and the second width is greater than a width of the at least one first bonding pad.

20 Claims, 30 Drawing Sheets

(51) Int. Cl.
*H01L 23/528* (2006.01)
*H01L 27/11556* (2017.01)
*H01L 23/00* (2006.01)
*H01L 27/11526* (2017.01)
*H01L 27/11568* (2017.01)
*H01L 27/11573* (2017.01)
*H01L 27/11582* (2017.01)
*H01L 25/00* (2006.01)

(52) U.S. Cl.
CPC .............. *H01L 24/09* (2013.01); *H01L 24/89* (2013.01); *H01L 25/50* (2013.01); *H01L 27/11521* (2013.01); *H01L 27/11526* (2013.01); *H01L 27/11556* (2013.01); *H01L 27/11568* (2013.01); *H01L 27/11573* (2013.01); *H01L 27/11582* (2013.01); *H01L 2224/0557* (2013.01); *H01L 2224/08147* (2013.01); *H01L 2224/0913* (2013.01); *H01L 2224/80001* (2013.01)

(58) Field of Classification Search
CPC ......... H01L 27/11521; H01L 27/11526; H01L 27/11556; H01L 27/11568; H01L 27/11573
See application file for complete search history.

(56) References Cited

U.S. PATENT DOCUMENTS

| | | | |
|---|---|---|---|
| 9,240,405 B2 | 1/2016 | Chen et al. | |
| 9,991,282 B1 | 6/2018 | Shimizu et al. | |
| 2006/0186485 A1* | 8/2006 | Cho | H01L 27/11529 257/401 |
| 2006/0239069 A1* | 10/2006 | Kamigaichi | G11C 16/0483 365/185.01 |
| 2008/0169567 A1* | 7/2008 | Kai | H01L 27/115 257/773 |
| 2009/0227080 A1* | 9/2009 | Jeon | H01L 27/11524 438/257 |
| 2009/0238002 A1* | 9/2009 | Wong | H01L 27/11521 365/185.17 |
| 2010/0032747 A1* | 2/2010 | Okamura | H01L 27/11524 257/326 |
| 2010/0085812 A1* | 4/2010 | Kang | G11C 16/0483 365/185.17 |
| 2010/0117135 A1* | 5/2010 | Mizukami | H01L 27/1203 257/314 |
| 2010/0155813 A1* | 6/2010 | Murata | H01L 27/11526 257/316 |
| 2010/0155820 A1* | 6/2010 | Park | H01L 27/11521 257/324 |
| 2010/0176422 A1* | 7/2010 | Fukuda | H01L 27/11526 257/208 |
| 2010/0187593 A1* | 7/2010 | Morikado | H01L 27/11521 257/316 |
| 2012/0267689 A1 | 10/2012 | Chen et al. | |
| 2016/0267946 A1 | 9/2016 | Ahn et al. | |
| 2016/0343610 A1* | 11/2016 | Shao | H01L 21/4857 |
| 2017/0373084 A1 | 12/2017 | Shim et al. | |
| 2018/0102316 A1 | 4/2018 | Kim | |
| 2020/0006270 A1 | 1/2020 | Lee et al. | |

* cited by examiner

SEMICONDUCTOR DEVICES

CROSS-REFERENCE TO RELATED APPLICATION(S)

This application is a continuation application of U.S. patent application Ser. No. 16/414,083, filed May 16, 2019, which claims benefit of priority to Korean Patent Application No. 10-2018-0116806 filed on Oct. 1, 2018 in the Korean Intellectual Property Office, the disclosure of each of which is incorporated herein by reference in its entirety.

BACKGROUND

1. Field

The present inventive concept relates to a semiconductor device.

2. Description of Related Art

Semiconductor devices are increasingly required to process high-capacity data while gradually being reduced in volume. Correspondingly, there is a need to increase a degree of integration of semiconductor elements forming such semiconductor devices. Resultantly, as one method of increasing a degree of integration of semiconductor elements, a semiconductor device having a vertical transistor structure in place of a conventional planar transistor structure has been proposed.

SUMMARY

An aspect of the present inventive concept is to provide a semiconductor device having improved reliability and a method for manufacturing the same.

According to an aspect of the present inventive concept, a semiconductor device includes: a first substrate structure including a first substrate, gate electrodes stacked and separated from each other in a first direction, perpendicular to a first surface of the first substrate, and extended by different lengths in a second direction, parallel to the first surface of the first substrate, to provide contact regions, cell contact plugs extending in the first direction and connected to the gate electrodes in the contact regions, and first bonding pads disposed on the cell contact plugs to be electrically connected to the cell contact plugs, respectively; and a second substrate structure, connected to the first substrate structure on the first substrate structure, and including a second substrate, circuit elements disposed on the second substrate and electrically connected to the gate electrodes, and a second bonding pad disposed on the circuit elements to correspond to the first bonding pads and bonded to the first bonding pads, wherein, in the first substrate structure, the contact regions include a first group of contact regions each having a first width in the second direction and a second group of contact regions, wherein for each contact region of the second group, at least a portion of the contact region vertically overlaps at least one first bonding pad, and the contact region has a second width in the second direction greater than the first width, and the second width is greater than a width of the at least one first bonding pad.

According to an aspect of the present inventive concept, which may be the same or a different embodiment as the above-described aspect, a semiconductor device includes: a first substrate structure including a first substrate having a cell array region and a connection region, gate electrodes stacked and separated from each other in a first direction, perpendicular to a first surface of the first substrate, in the cell array region and extended by different lengths in a second direction, parallel to the first surface of the first substrate, in the connection region to provide contact regions, first channels passing through the gate electrodes and extending in the first direction in the cell array region, first bit lines electrically connected to the first channels, cell contact plugs extending in the first direction and electrically connected to the gate electrodes in the contact regions, and first bonding pads, each bonding pad disposed to be connected to a bit lien of the bit lines or a cell contact plug of the cell contact plugs; and a second substrate structure, connected to the first substrate structure on the first substrate structure, and including a second substrate, circuit elements disposed on the second substrate and electrically connected to the gate electrodes, and second bonding pads disposed on the circuit elements to correspond to the first bonding pads and respectively bonded to the first bonding pads, wherein, in the cell array region, the first bonding pads are arranged in rows and columns, and at least a portion of each first bonding pad of the first bonding pads is arranged to overlap in the first direction a respective bit line to which is it is electrically connected.

According to an aspect of the present inventive concept, which may be the same or a different embodiment as the above-described aspect, a semiconductor device includes: a first substrate structure including a first substrate having a cell array region and a connection region, gate electrodes stacked and separated from each other in a first direction, perpendicular to a first surface of the first substrate, in the cell array region and extended by different lengths in a second direction, parallel to the upper surface of the first substrate, in the connection region to provide contact regions, first channels passing through the gate electrodes and extending in the first direction in the cell array region, first bit lines electrically connected to the first channels, cell contact plugs extending in the first direction and connected to the gate electrodes in the contact regions, and first bonding pads, each disposed to be connected to a respective first bit line or a respective cell contact plug; and a second substrate structure, connected to the first substrate structure on the first substrate structure, and including a second substrate, circuit elements disposed on the second substrate, and electrically connected to the gate electrodes, and second bonding pads disposed on the circuit elements to correspond to the first bonding pads and bonded to the first bonding pads, wherein the first bonding pads are arranged in different patterns in the cell array region and the connection region.

BRIEF DESCRIPTION OF DRAWINGS

The above and other aspects, features and other advantages of the present disclosure will be more clearly understood from the following detailed description, taken in conjunction with the accompanying drawings, in which.

DETAILED DESCRIPTION

Hereinafter, the example embodiments of the present disclosure will be described in detail with reference to the attached drawings.

Figure 1:
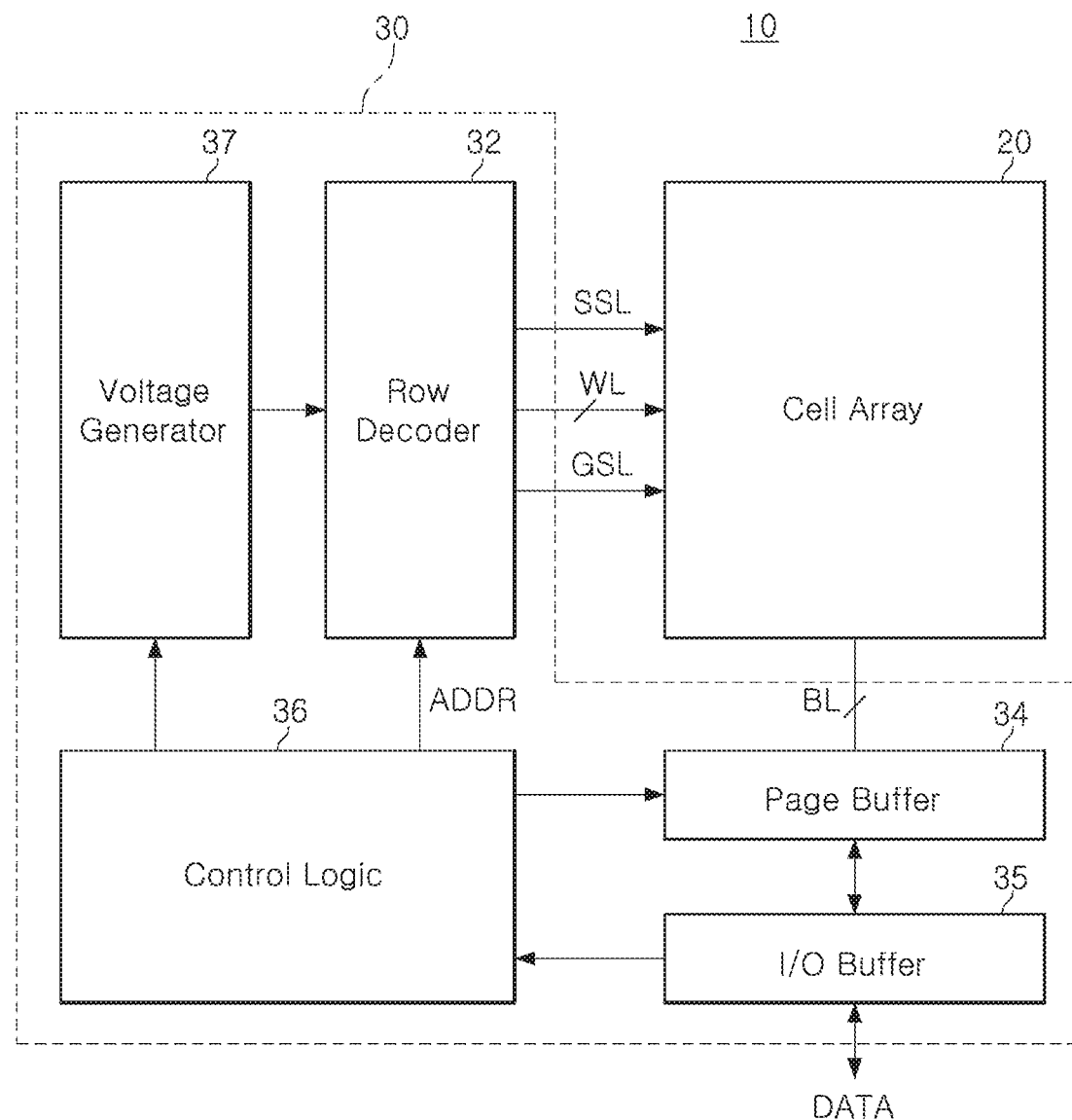
FIG. 1 is a schematic block diagram illustrating a semiconductor device according to example embodiments.

FIG. 1 is a schematic block diagram illustrating a semiconductor device according to example embodiments.

Referring to FIG. 1, a semiconductor device 10 may include a memory cell array 20 and a peripheral circuit 30. The peripheral circuit 30 may include a row decoder 32, a page buffer 34, an input/output (I/O) buffer 35, a control logic 36, and a voltage generator 37.

The memory cell array 20 may include a plurality of memory blocks, and each of the memory blocks may include a plurality of memory cells. The plurality of memory cells may be connected to the row decoder 32 through a string select line SSL, word lines WL, and a ground select line GSL, and may be connected to the page buffer 34 through bit lines BL. In example embodiments, a plurality of memory cells arranged in an identical row may be connected to an identical word line WL, and a plurality of memory cells arranged in an identical column may be connected to an identical bit line BL.

The row decoder 32 may decode an address ADDR, having been input, and may thus generate and transmit driving signals of the word line WL. The row decoder 32 may provide a word line voltage, generated by the voltage generator 37, to a selected word line WL and unselected word lines WL, in response to control of the control logic 36.

The page buffer 34 is connected to the memory cell array 20 through the bit lines BL, and thus read information stored in the memory cells. The page buffer 34 may temporarily store data to be stored in the memory cells, or may sense data, stored in the memory cell, according to a mode of operation. The page buffer 34 may include a column decoder and a sense amplifier. The column decoder may selectively activate bit lines BL of the memory cell array 20, while the sense amplifier may sense a voltage of a bit line BL, selected by the column decoder, and may thus read data, stored in a memory cell, having been selected.

The I/O buffer 35 may receive data DATA and transfer the data to the page buffer 34 during a programming operations, and may output the data DATA, transferred by the page buffer 34, externally, during a reading operation. The I/O buffer 35 may transmit address or command, having been input, to the control logic 36.

The control logic 36 may control operation of the row decoder 32 and the page buffer 34. The control logic 36 may receive a control signal and an external voltage, transmitted from an external source, and may be operated according to a control signal, having been received. The control logic 36 may control reading, writing, and/or erasing operations in response to the control signals.

The voltage generator 37 may generate voltages, for example, programming voltage, reading voltage, erasing voltage, and the like, required for an internal operation using an external voltage. The voltage, generated by the voltage generator 37, may be transferred to the memory cell array 20 through the row decoder 32.

Figure 2:
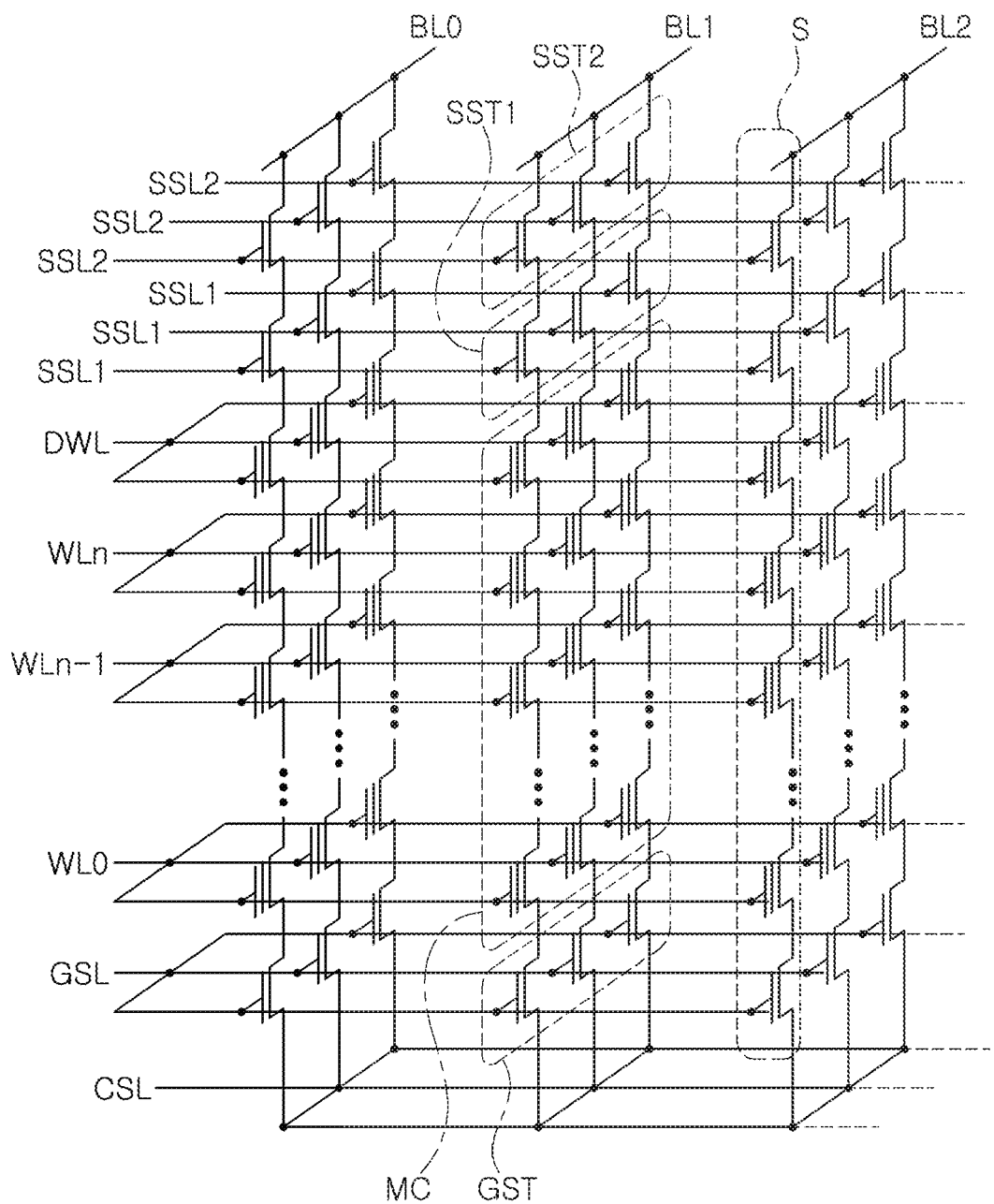
FIG. 2 is an equivalent circuit diagram of a cell array of a semiconductor device according to example embodiments.

FIG. 2 is an equivalent circuit diagram of a cell array of a semiconductor device according to example embodiments.

Referring to FIG. 2, the memory cell array 20 may include a plurality of memory cell strings S, each of which includes memory cells MC connected to each other in series, and a ground select transistor GST and string select transistors SST1 and SST2 connected to both ends of the memory cells MC in series. The plurality of memory cell strings S may be connected to respective bit lines BL0 to BL2 in parallel. The plurality of memory cell strings S may be connected to a common source line CSL in common. The plurality of memory cell strings S may be disposed between the plurality of bit lines BL0 to BL2 and a single common source line CSL. In an example embodiment, a plurality of common source lines CSL may be arranged two-dimensionally.

The memory cells MC, connected to each other in series, may be controlled by word lines WL0 to WLn for selecting the memory cells MC. Each of the memory cells MC may include a data storage element. Gate electrodes of the memory cells MC, arranged at substantially the same distance from the common source line CSL, may be commonly connected to one of the word lines WL0 to WLn and may be in an equipotential state. Alternatively, even when the gate electrodes of the memory cells MC are arranged at substantially the same distance from the common source line CSL, gate electrodes, disposed in different rows or columns, may be controlled independently.

The ground select transistor GST may be controlled by a ground select line GSL, and may be connected to a common source line CSL. The string select transistors SST1 and SST2 may be controlled by the string select lines SSL1 and SSL2, and may be connected to the bit lines BL0 to BL2. FIG. 2 illustrates a structure in which a single ground select transistor GST and two string select transistors SST1 and SST2 are connected to the plurality of memory cells MC connected to each other in series, respectively. In a different manner, a single string select transistor, each of string select transistors SST1 and SST2, or a plurality of ground select transistors GST may also be connected to the memory cells MC. One or more dummy lines DWL or buffer lines may be further disposed between an uppermost word line WLn, among the word lines WL0 to WLn, and the string select lines SSL1 and SSL2. In an example embodiment, one or more dummy lines DWL may also be disposed between a lowermost word line WL0 and the ground select line GSL. In the present specification, the term "dummy" may have the same or similar structure and shape to that of other components, and may only be used to refer to a component present as a pattern without a practical function within a device (e.g., it may be connected to memory cells whose stored information is ignored by a host or controller).

When a signal is applied to the string select transistors SST1 and SST2 through the string select lines SSL1 and SSL2, a signal, applied through the bit lines BL0 to BL2, may be transmitted to the memory cells MC, connected to each other in series, and a data reading operation and a data writing operation may be performed. Moreover, a predetermined erasing voltage is applied through a substrate, so an erasing operation for erasing data, written on the memory cells MC, may be performed. In an example embodiment, the memory cell array 20 may include at least one dummy memory cell string, electrically isolated from the bit lines BL0 to BL2.

Figure 3:
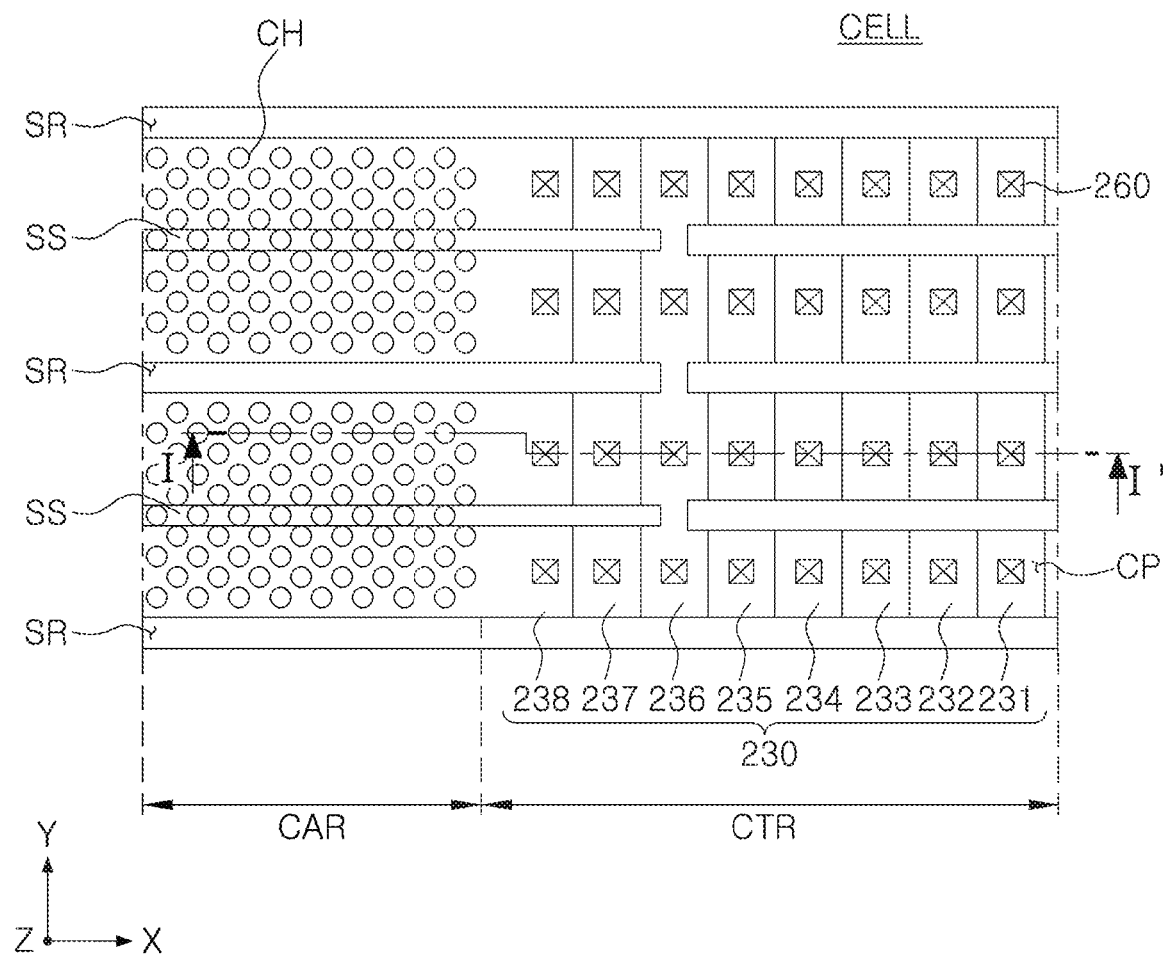
FIG. 3 is a schematic plan view illustrating a semiconductor device according to example embodiments.
Figure 4:
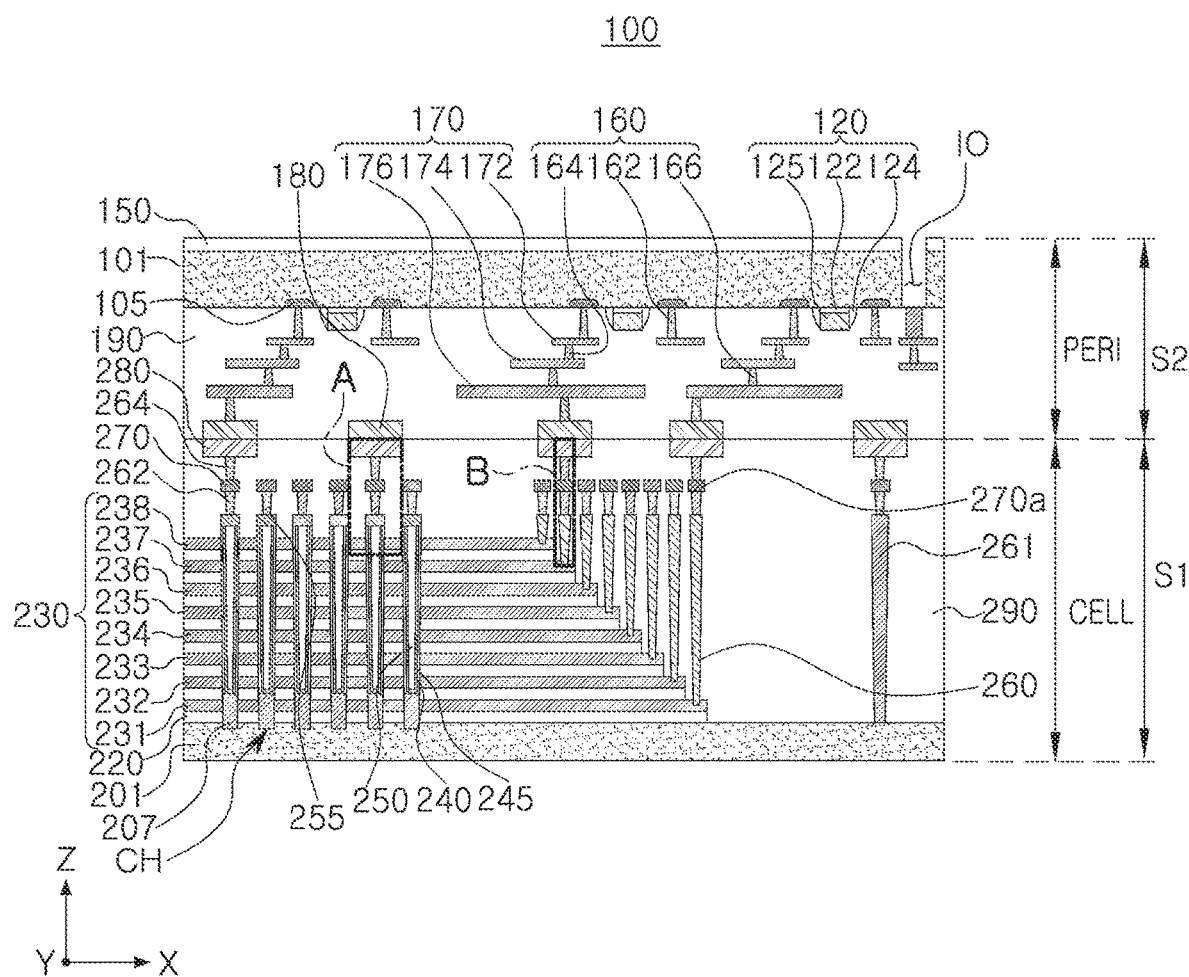
FIG. 4 is a schematic cross-sectional view illustrating a semiconductor device according to example embodiments.

FIG. 3 is a schematic plan view illustrating a semiconductor device according to example embodiments. In FIG. 3, main components of a memory cell region CELL of the semiconductor device 100 are only illustrated for the sake of understanding. FIG. 4 is a schematic cross-sectional view illustrating a semiconductor device according to example embodiments. FIG. 4 illustrates a cross section cut along line I-I' of FIG. 3.

Referring to FIGS. 3 and 4, the semiconductor device 100 may include a first substrate structure S1 and a second substrate structure S2, vertically stacked. The first substrate structure S1 may include a memory cell region CELL, while the second substrate structure S2 may include a peripheral circuit region PERI.

In the first substrate structure S1, as illustrated in FIG. 3, the memory cell region CELL may include a substrate 201, such as a semiconductor substrate that may be referred to as a first or second substrate, having a cell array region CAR, which is a first region, and a cell connection region CTR, which is a second region, gate electrodes 230 stacked on the substrate 201, interlayer insulating layers 220 alternately stacked with the gate electrodes 230, gate separation regions SR extended while passing through a stacked structure of the gate electrodes 230, upper separation regions SS passing through a portion of the gate electrodes 230, channels CH disposed to pass through the gate electrodes 230, and a cell region insulating layer 290 covering the gate electrodes 230. The memory cell region CELL may further include channel regions 240, gate dielectric layers 245, channel insulating layers 250, and channel pads 255, in the channels CH. The memory cell region CELL may further include cell contact plugs 260, through contact plugs 261, first conductive plugs 262, bit lines 270 and 270a, second conductive plugs 264, and first bonding pads 280, which are wiring structures for applying a signal to the channels CH and the gate electrodes 230.

The cell array region CAR of the substrate 201 may be a region in which the gate electrodes 230 are vertically stacked and channels CH are disposed, and may be a region corresponding to the memory cell array 20 of FIG. 1, while the cell connection region CTR may be a region in which the gate electrodes 230 are extended lengthwise by different lengths, and may correspond to a region for electrically connecting the memory cell array 20 to the peripheral circuit 30 of FIG. 1. An item, layer, or portion of an item or layer described as extending "lengthwise" in a particular direction has a length in the particular direction and a width perpendicular to that direction, where the length is greater than the width. The cell connection region CTR may be disposed in at least one end of the cell array region CAR in at least one direction, for example, and an X-direction.

The substrate 201 may have the upper surface extending in the X-direction and a Y-direction. The upper surface may generally be referred to as a first surface. It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

The substrate 201 may include a semiconductor material, such as a Group IV semiconductor, a Group III-V compound semiconductor, or a Group II-VI oxide semiconductor. For example, the Group IV semiconductor may include silicon, germanium, or silicon-germanium. For example, the substrate 201 may be provided as a single crystal layer or an epitaxial layer. The substrate 201 may be referred to as a memory cell region semiconductor substrate.

The gate electrodes 230 may be stacked and spaced apart from each other perpendicular to the substrate 201, thereby forming a stacked structure together with the interlayer insulating layers 220. The gate electrodes 230 may include a lower gate electrode 231, forming a gate of the ground select transistor GST of FIG. 2, memory gate electrodes 232 to 236, forming a plurality of memory cells MC, and upper gate electrodes 237 and 238, forming a gate of the string select transistors SST1 and SST2. The number of the memory gate electrodes 232 to 236, forming the memory cells MC, may be determined depending on capacity of the semiconductor device 100. According to an example embodiment, the upper and lower gate electrodes 231, 237, and 238 of the string select transistors SST1 and SST1 and the ground select transistor GST may be provided in an amount of one or two or more, and may have the same or different structure from that of the gate electrodes 230 of the memory cells MC. Some gate electrodes 230, for example, memory gate electrodes 232 to 236, adjacent to the upper or lower gate electrode 231, 237, and 238, may be dummy gate electrodes.

The gate electrodes 230 may be stacked and spaced apart from each other perpendicular to the cell array region CAR, and may extend lengthwise by different lengths from the cell array region CAR into the cell connection region CTR to form a stepped staircase structure. The gate electrodes 230 are stepped in the X-direction as illustrated in FIG. 4, and may be disposed to be stepped in the Y-direction. Due to the stepped portion, a lower gate electrode 230 is extended longer than an upper gate electrode 230, so the gate electrodes 230 may provide contact regions CP exposed upwardly. The gate electrodes 230 may be connected to the cell contact plugs 260 in the contact regions CP, respectively. The contact regions CP may be referred to and described as word line connection pads. As described below, in some embodiments, the word line connection pads, or contact regions CP, may include raised portions, and may be described as raised pad portions.

As illustrated in FIG. 3, the gate electrodes 230 may be disposed to be separated from each other in the Y-direction by gate separation regions SR extending in the X-direction. Gate electrodes 230, between a pair of gate separation regions SR continuously extending in the X-direction among the gate separation regions SR, may form a single memory block, but a range of a memory block is not limited thereto. A portion of the gate electrodes 230, for example, memory gate electrodes 232 to 236 may form a single layer in a single memory block.

The interlayer insulating layers 220 may be disposed between the gate electrodes 230. The interlayer insulating layers 220 may also be disposed to be spaced apart from each other in a direction perpendicular to the upper surface of the substrate 201 and to extend lengthwise in the X-direction, in a manner similar to the gate electrodes 230. The interlayer insulating layers 220 may contain an insulating material, such as silicon oxide or silicon nitride.

The gate separation regions SR may be disposed to pass through the gate electrodes 230 in the cell array region CAR and the cell connection region CTR and to extend in the X-direction. The gate separation regions SR may be arranged parallel to each other. In the gate separation regions SR, a continuously extended pattern and an intermittently extended pattern may be alternately disposed in the Y-direction. However, the arrangement order, the number, and the like, of the gate separation regions SR, are not limited to those illustrated in FIG. 3. The gate separation regions SR may pass through the entirety of the gate electrodes 230, stacked on the substrate 201, and may be connected to the substrate 201. The common source line CSL, described with reference to FIG. 2, may be disposed in the gate separation regions SR, and the dummy common source line may be disposed in at least a portion of the gate separation regions. However, the common source line CSL may be disposed in the substrate 201, according to example embodiments.

Upper separation regions SS may extend in the X-direction between the gate separation regions SR. The upper separation regions SS may be disposed in a portion of the cell connection region CTR and the cell array region CAR, to pass through a portion of gate electrodes 230, including the upper gate electrodes 237 and 238, among the gate electrodes 230. The upper gate electrodes 237 and 238, separated by the upper separation regions SS, may form different string select lines SSL1 and SSL2 (see FIG. 2). The upper separation regions SS may include an insulating layer. The upper separation regions SS, may separate, for example, a total of three gate electrodes 230, including the upper gate electrodes 237 and 238, from each other in the Y-direction. However, the number of the gate electrodes 230, separated by the upper separation regions SS, may be variously changed in example embodiments. In example embodiments, the substrate structure S1 may further include insulating layers separating lower gate electrodes 231 among the gate electrodes 230. For example, the insulating layer may be disposed to separate lower gate electrodes 231 in a region between the gate separation regions SR, spaced apart from each other on a straight line and arranged intermittently.

The channels CH may be spaced apart from each other in rows and columns on the cell array region CAR. The channels CH may be disposed to form a grid pattern or disposed in a zigzag form in a direction. The channel CH may have a columnar shape, and may have an inclined side surface narrowing towards the substrate 201 according to aspect ratios. In example embodiments, dummy channels may be further disposed in an end portion of the cell array region CAR, adjacent to the cell connection region CTR, and the cell connection region CTR.

A channel region 240 may be disposed in the channels CH. In the channel CH, the channel region 240 may have an annular form surrounding the channel insulating layer 250, formed therein. However, the channel region may have a columnar shape without the channel insulating layer 250, such as a cylinder or a prism, according to an example embodiment. The channel region 240 may be connected to an epitaxial layer 207 in a lower portion of the channel region. The channel region 240 may contain a semiconductor material such as polycrystalline silicon or monocrystalline silicon, and the semiconductor material may be a material undoped with an impurity, or a material containing a p-type or n-type impurity. Channels CH, disposed on a straight line in the Y-direction between the gate separation regions SR and the upper separation region SS, may be connected to different bit lines 270, according to arrangement of an upper wiring structure connected to the channel pad 255.

Channel pads 255 may be disposed in an upper portion of the channel region 240 in the channels CH. The channel pads 255 may be disposed to cover an upper surface of the channel insulating layer 250 and to be electrically connected to the channel region 240. The channel pads 255 may include, for example, doped polycrystalline silicon.

The gate dielectric layer 245 may be disposed between the gate electrodes 230 and the channel region 240. Although not specifically illustrated, the gate dielectric layer 245 may include a tunneling layer, a charge storage layer, and a blocking layer sequentially stacked from the channel region 240. The tunneling layer may allow a charge to tunnel to the charge storage layer, and may include, for example, silicon oxide ($SiO_2$), silicon nitride ($Si_3N_4$), silicon oxynitride (SiON), or combinations thereof. The charge storage layer may be a charge trap layer or a floating gate conductive layer. The blocking layer may include silicon oxide ($SiO_2$), silicon nitride ($Si_3N_4$), silicon oxynitride (SiON), a high-k dielectric material or combinations thereof. In example embodiments, at least a portion of the gate dielectric layer 245 may be extended in a horizontal direction along the gate electrodes 230.

The epitaxial layer 207 may be disposed on the substrate 201 in a lower end of the channels CH, and may be disposed in a side surface of at least one gate electrode 230. The epitaxial layer 207 may be disposed in a recessed region of the substrate 201. A level of an upper surface of the epitaxial layer 207 may be higher than a level of an upper surface of a lowermost gate electrode 231 and may be lower than a level of a lower surface of a gate electrode 232 located thereabove, but it is not limited to that illustrated in the drawings. In example embodiments, the epitaxial layer 207 may be omitted. In this case, the channel region 240 may be directly connected to the substrate 201 or may be connected to another conductive layer on the substrate 201.

The memory cell region CELL may further include cell contact plugs 260, through contact plugs 261, first conductive plugs 262, bit lines 270, and wiring lines 270a, second conductive plugs 264, and first bonding pads 280, which are wiring structures for electrical connection with the second substrate structure S2. The wiring structures described above may include a conductive material. The wiring structures may include, for example, tungsten (W), aluminum (Al), copper (Cu), a tungsten nitride (WN), a tantalum nitride (TaN), a titanium nitride (TiN), or combinations thereof.

The cell contact plugs 260 may pass through the cell region insulating layer 290 to be connected to the gate electrodes 230 in the contact regions CP. The cell contact plugs 260 may have a cylindrical shape. In example embodiments, the cell contact plugs 260 may have an inclined side surface narrowing towards the substrate 201 according to aspect ratios. Thus, the first cell contact plugs 260 may have a tapered shape that tapers toward the first substrate 201. According to example embodiments, some of the cell contact plugs 260, connected to certain gate electrodes 230, may be dummy contact plugs.

The through contact plugs 261 may extend vertically to pass through the cell region insulating layer 290 to be connected to the substrate 201, and may be connected to the second substrate structure S2 through the first bonding pad 280 at an upper end.

The first conductive plugs 262 may be disposed on the channels CH, the cell contact plugs 260, and the through contact plugs 261.

The bit lines 270 and wiring lines 270a may be disposed between the first cell contact plugs 262 and the second cell contact plugs 264 at an upper end of the first conductive plugs 262. The bit lines 270 and wiring lines 270a may include bit lines 270 connected to the channels CH, and bit lines 270a connected to lower contact plugs 262, and the bit lines 270, connected to the channels CH, may correspond to the bit lines BL0 to BL2 of FIG. 2 (noting that FIG. 2A is just a representative portion of the overall semiconductor device 100, and does not show the same number of first bit lines as FIG. 4). The wiring lines 270a, connected to the first conductive plugs 262, do not function as bit lines, and may include wiring lines formed at the same vertical level, in the same process as that of the bit lines 270 connected to the channels CH. The wiring lines 270a, connected to the first conductive plugs 262, are illustrated as being disposed on all gate electrodes 230, but are not limited thereto.

The second conductive plugs 264 are disposed on the bit lines 270 and wiring lines 270a, and may be connected to the first bonding pads 280 in an upper portion.

The first bonding pads 280 are disposed on the second conductive plugs 264, and an upper surface of the first bonding pads may be exposed to an upper surface of the first substrate structure S1 through the first cell region insulating layer 290. The first bonding pads 280 may serve as a bonding layer for bonding the first substrate structure S1 and the second substrate structure S2. Bonding pads, or other pads, as described herein, are formed of conductive material and have a substantially flat, or planar, outer surface. The first bonding pads 280 may have a large planar area as compared with other wiring structures, in order to be bonded with the second substrate structure S2 and to provide an electrical connection path thereby. The first bonding pads 280 may be disposed to vertically overlap with the bit lines 270 and the cell contact plugs 261 in a Z-direction on the bit lines 270 and the cell contact plugs 261, electrically connected to each other, but are not limited thereto.

The first bonding pads 280 may be arranged in a constant pattern in each of the cell array region CAR and the cell connection region CTR. The first bonding pads 280 may be disposed at the same level (e.g., vertical level) in the cell array region CAR and the cell connection region CTR, and may have the same or different sizes. Moreover, the first bonding pads 280 may be arranged in the same or different patterns in each of the cell array region CAR and the cell connection region CTR. The first bonding pads 280 may have, for example, a quadrangular, circular, or elliptical shape, on a plane, but are not limited thereto. The first bonding pads 280 may include a conductive material, for example, copper (Cu).

The cell region insulating layer 290 may be formed of an insulating material. In example embodiments, the cell region insulating layer 290 may include a bonding dielectric layer to a predetermined thickness at an upper end in which the first bonding pad 280 is disposed. The bonding dielectric layer is disposed on a lower surface of the second substrate structure S2, so dielectric-dielectric bonding may be performed thereon. The bonding dielectric layer may function as a diffusion barrier layer of the first bonding pad 280, and may include at least one of, for example, SiO, SiN, SiCN, SiOC, SiON, and SiOCN.

In the second substrate structure S2, the peripheral circuit region PERI may include a base substrate 101, circuit elements 120 disposed on the base substrate 101, a passivation layer 150, circuit contact plugs 160, circuit wiring lines 170, and second bonding pads 180.

The base substrate 101, which may be a semiconductor substrate and may be described as a first or second substrate or a peripheral circuit substrate, may have the upper surface extending in the X-direction and a Y-direction. A first surface of the base substrate 101 may face the substrate 201. The base substrate 101 may have separate element separation layers formed therein such that an active region may be defined. A portion of the active region may have source/drain regions 105 disposed therein and including an impurity. The base substrate 101 may include a semiconductor material, such as a Group IV semiconductor, a Group III-V compound semiconductor, or a Group II-VI oxide semiconductor. For example, the base substrate 101 may be provided as a single crystal bulk wafer.

The circuit elements 120 may include, for example, a horizontal transistor. Each of the circuit elements 120 may include a circuit gate dielectric layer 122, a spacer layer 124, and a circuit gate electrode 125. The source/drain regions 105 may be disposed in the base substrate 101 on both sides of the circuit gate electrode 125.

The passivation layer 150 may be disposed on a surface in which the circuit elements 120 are not disposed in the base substrate 101, for example, a second surface of the base substrate 101 opposite the first surface that faces the substrate 201. The passivation layer 150 may serve to protect the semiconductor device 100 from external moisture, impurities, and the like. A pad region IO for electrical connection to an outside may be formed in the passivation layer 150, and the pad region IO may pass through the base substrate 101 to expose a wiring structure. However, a structure of the pad region IO is not limited thereto, and may be variously changed in example embodiments. The passivation layer 150 may include an insulating material.

The peripheral region insulating layer 190 may be disposed on the circuit element 120 on the base substrate 101. The circuit contact plugs 160 may pass through the peripheral region insulating layer 190 to be connected to the source/drain regions 105, and may include first to third circuit contact plugs 162, 164, and 166, sequentially positioned from the base substrate 101. The circuit contact plugs 160 may allow an electrical signal to be applied to the circuit element 120. In a region not illustrated, the circuit contact plugs 160 may be connected even to the circuit gate electrode 125. The circuit wiring lines 170 may be connected to the circuit contact plugs 160, and may include first to third circuit wiring lines 172, 174, and 176, forming a plurality of layers.

The second bonding pads 180 are disposed to be connected to the third circuit contact plugs 166, and one surface of the second bonding pads 180, a lower surface in FIG. 4, facing the first substrate structure S1, may be exposed to a lower surface of the second substrate structure S2 through the peripheral region insulating layer 190. In some embodiments, the lower surface of the second bonding pads 180 (e.g., a surface facing the first substrate structure S1) is exposed to an outside of the second substrate structure S2 and is coplanar with a surface of the peripheral region insulating layer 190. The second bonding pads 180 may serve as a bonding layer for bonding the first substrate structure S1 and the second substrate structure S2, with the first bonding pads 280. The second bonding pads 180 may have a large planar area as compared with other wiring structures, in order to be bonded with the first substrate structure S1 and to provide an electrical connection path thereby. The second bonding pads 180 may be disposed in a position corresponding to that of the first bonding pads 280 (e.g., to vertically overlap), and may have a size the same as or similar to that of the first bonding pads 280. The second bonding pads 180 may include a conductive material, for example, copper (Cu).

The first substrate structure S1 and the second substrate structure S2 may be bonded by bonding of the first bonding pads 280 and the second bonding pads 180, for example, copper (Cu)-to-copper (Cu) bonding. The first bonding pads 280 and the second bonding pads 180 may have an area relatively larger than that of other configurations of the wiring structure, so reliability of the electrical connection between the first substrate structure S1 and the second substrate structure S2 may be improved. In example embodiments, the first substrate structure S1 and the second substrate structure S2, may be bonded by hybrid bonding due to bonding of the first bonding pads 280 and the second bonding pads 180, and dielectric-to-dielectric bonding of the cell region insulating layer 290 and the peripheral region insulating layer 190, disposed around the first bonding pads 280 and the second bonding pads 180.

Figure 5A:
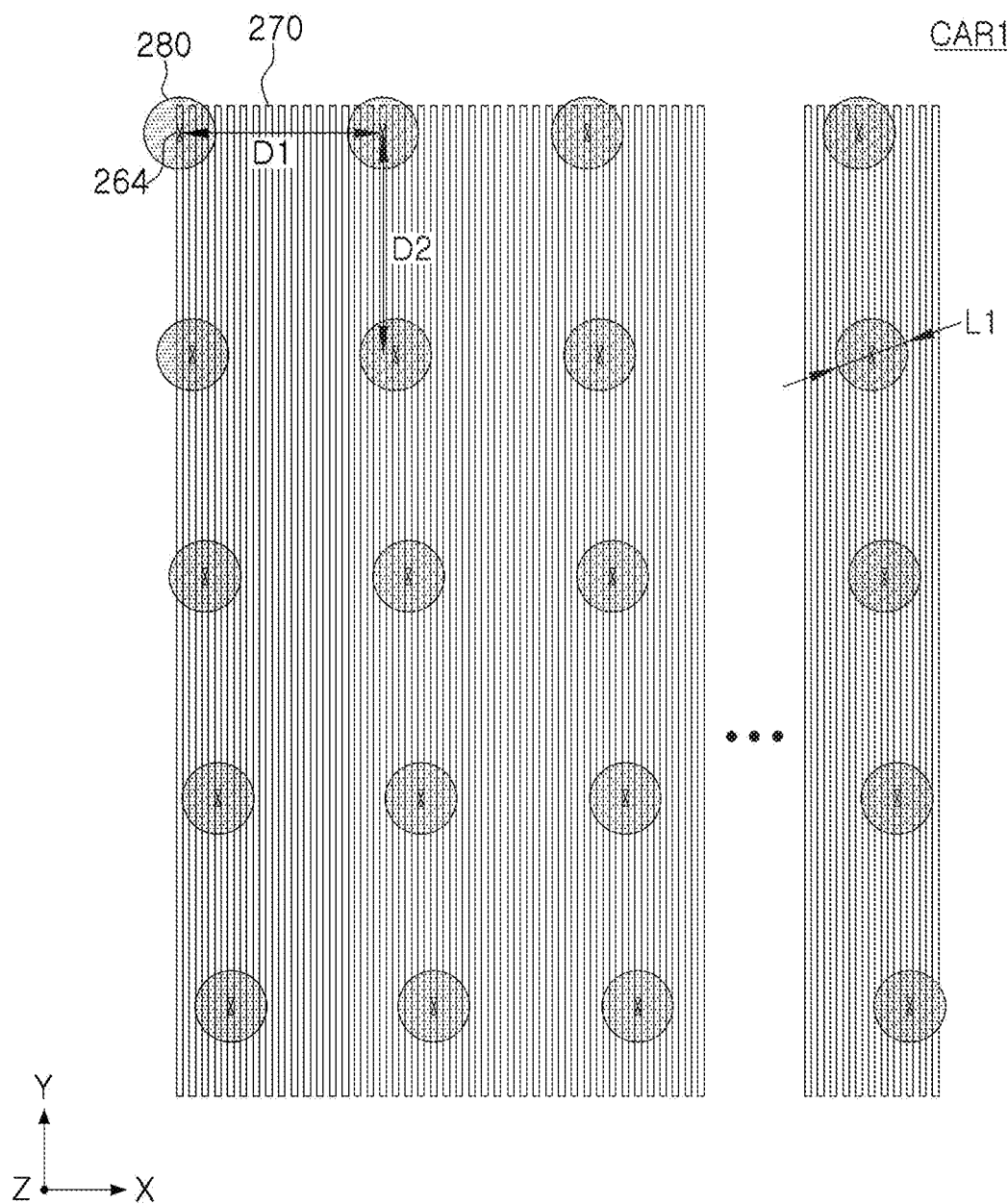
FIGS. 5A and 5B are layout diagrams illustrating a portion of a semiconductor device according to example embodiments.
Figure 5B:
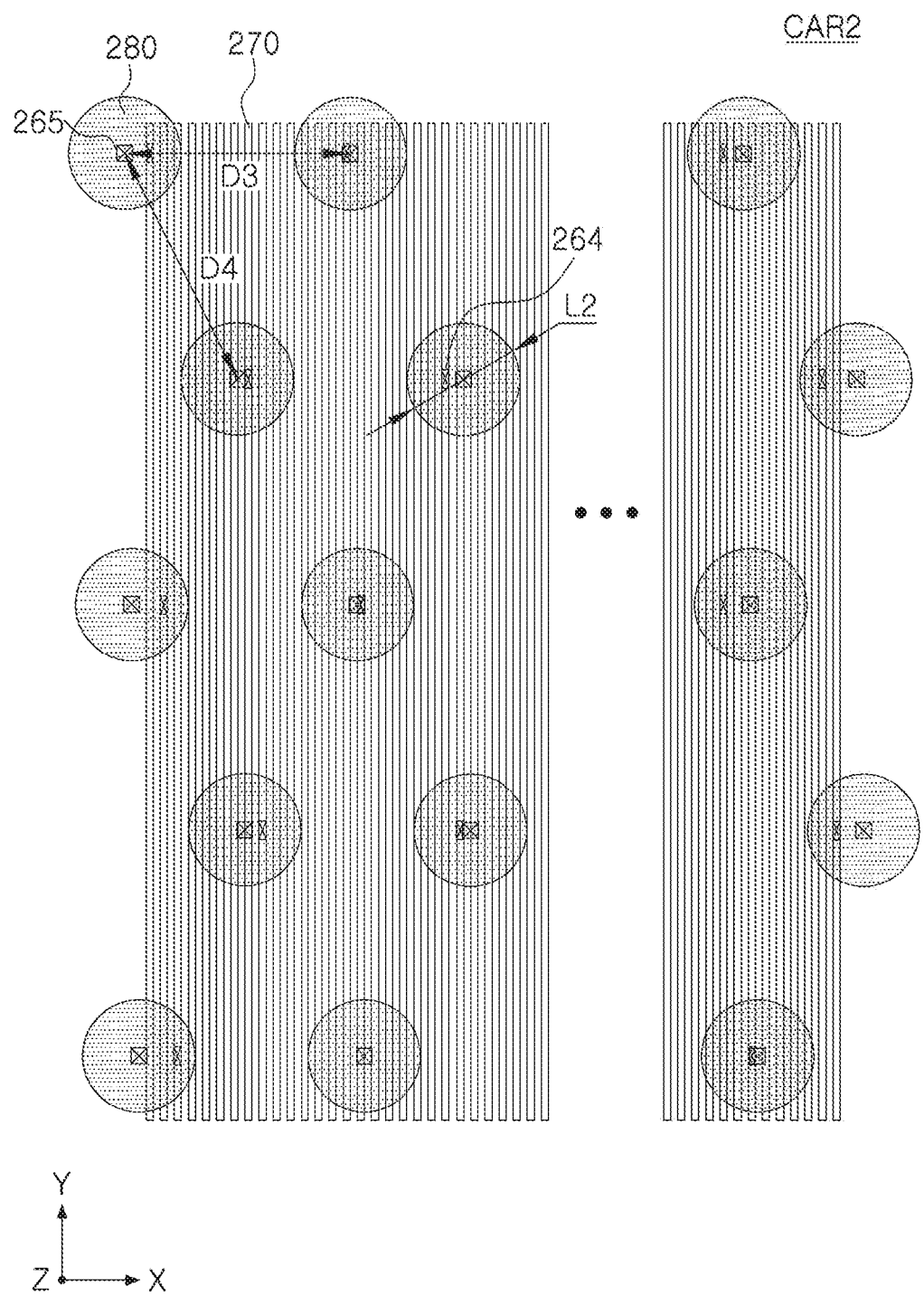

FIGS. 5A and 5B are layout diagrams illustrating a portion of a semiconductor device according to example embodiments. FIGS. 5A and 5B illustrate a layout of a main configuration in the cell array region CAR of FIG. 3.

Referring to FIG. 5A, in a cell array region CAR1, arrangement on the plane, of the bit lines 270, the second conductive plugs 264, and the first bonding pads 280, sequentially stacked, is illustrated. In the cell array region CAR1, a portion in the Y-direction is only illustrated.

The bit lines 270 have a line shape extending in the Y-direction. For example, two bit lines may be disposed over an upper portion of a single channel CH. The first bonding pads 280 may be disposed over an upper portion of the bit lines 270, and at least one first bonding pad 280 may be connected to each bit line 270. The first bonding pads 280 may be disposed to vertically overlap the bit line 270 connected thereto, and may be connected to the bit line 270 through the second conductive plug 264. Thus, the first bonding pads 280 may be disposed on a region in which the bit lines 270 are arranged. The second conductive plug 264 is illustrated as a quadrangle, but is not limited thereto, and may have various shapes such as an elongated, elliptical, or circular shape. Moreover, in example embodiments, the second conductive plug 264 extends in the Y-direction along the first bit line 270, and may be disposed longer than the first bonding pad 280.

The first bonding pads 280 may be arranged to form a diagonal pattern. For example, the first bonding pads 280 may form parallel rows formed on the bit lines 270, for example extending in a diagonal direction with respect to the extension direction of the bit lines 270. The first bonding pads 280 may be disposed to vertically overlap a plurality of respective bit lines 270 in the X-direction, by way of example. The first bonding pads 280 may be disposed on the bit lines 270, shifted in the X-direction and adjacent to each other, in the Y-direction. The first bonding pads 280 may have a first length L1, which may be greater than a length of the channel CH. Hereinafter, unless otherwise stated, a "length" in connection with channels or bonding pads as viewed from the Z-direction indicates a maximum length or maximum width.

The first bonding pads 280 have a first pitch D1 in the X-direction, and have a second pitch D2 in the Y-direction. Here, a "pitch" indicates a length between the centers of components adjacent to each other on a plane. When the components are spaced apart from each other, a "pitch" indicates a length, the sum of a maximum length of a component and a minimum distance between components. For example, when a region in which all bit lines 270 are disposed has a length in the Y-direction, greater than a length in the X-direction, the second pitch D2 may be greater than the first pitch D1. However, the relative sizes of the first pitch D1 and the second pitch D2 are not limited thereto. In example embodiments, the first pitch D1 and the second pitch D2 may be determined in consideration of a size of the cell array region CAR1, the number and a size of the bit lines 270, a size of the first bonding pads 280, and the like. The first pitch D1 and the second pitch D2 may range from several hundred nanometers to several micrometers, for example, from about 500 nm to about 3 μm.

Referring to FIG. 5B, in a cell array region CAR2, first bonding pads 280 may be disposed in a zigzag or hexagonal form, in a manner different from an example embodiment of FIG. 5A. The first bonding pads 280 may have a second length L2, equal to or greater than the first length L1 of an example embodiment of FIG. 5A, by way of example. The first bonding pads 280 have a third pitch D3 in the X-direction, and have a fourth pitch D4 in a diagonal-direction. The third pitch D3 and the fourth pitch D4 may be equal to each other, but are not limited thereto.

In the case of the first bonding pads 280, at least one first bonding pad 280 may be connected for each bit line 270. However, in an example embodiment, at least some of the first bonding pads 280 may not be symmetrically disposed over a bit line 270 to which the first bonding pad 280 is connected to (e.g., to have a center point vertically overlapping the bit line 270), and may be disposed in a region of which the center is shifted in the X-direction from the line 270. In this case, the first bonding pads 280 may be disposed to vertically overlap a bit line 270 connected thereto, but are they are not limited thereto. In example embodiments, the first bonding pads 280 may be disposed in a region in which the channels CH (see FIGS. 3 and 4) are not disposed, or may be disposed in a region in which the bit lines 270 are not disposed. In this case, the first bonding pads 280 may be connected to the bit lines 270 by an additional wiring line. The extended arrangement of the first bonding pads 280 described above is not limited to a case in which the first bonding pads 280 are disposed in a zigzag form in an example embodiment, and may be applied to both of example embodiments in which the first bonding pads are disposed regularly in rows and columns, and example embodiments in which the first bonding pads are disposed irregularly.

Figure 6A:
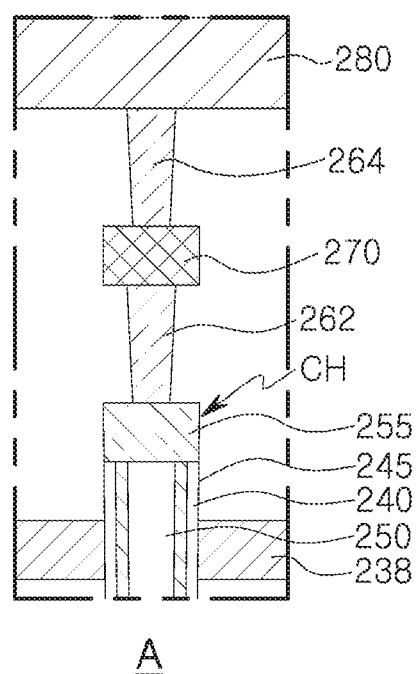
FIGS. 6A to 6D are schematic partially enlarged views illustrating a semiconductor device according to example embodiments.

FIGS. 6A to 6D are schematic partially enlarged views illustrating a semiconductor device according to example embodiments. FIG. 6A illustrates an enlarged region A of FIG. 4, and FIGS. 6B to 6D illustrate an enlarged region corresponding to the region A of FIG. 4.

Referring to FIG. 6A, arrangement of a wiring structure on an upper portion of the channel CH is enlarged and illustrated. As described above with reference to FIG. 4, the first conductive plug 262, the first bit line 270, the second conductive plug 264, and the first bonding pad 280 are sequentially disposed on an upper portion of the channel CH.

Figure 6B:
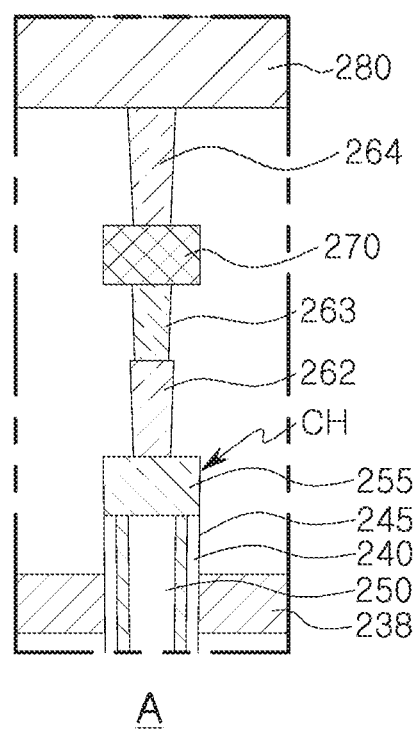

Referring to FIG. 6B, a wiring structure may include a first conductive plug 262, a third conductive plug 263, a bit line 270, a second conductive plug 264, and a first bonding pad 280, sequentially stacked on an upper portion of the channel CH. In this example embodiment, a third conductive plug 263 may be further disposed between the first conductive plug 262 and the bit line 270. The third conductive plug 263 may have a diameter smaller than a diameter of the first conductive plug 262 in a lower portion, but is not limited thereto.

Figure 6C:
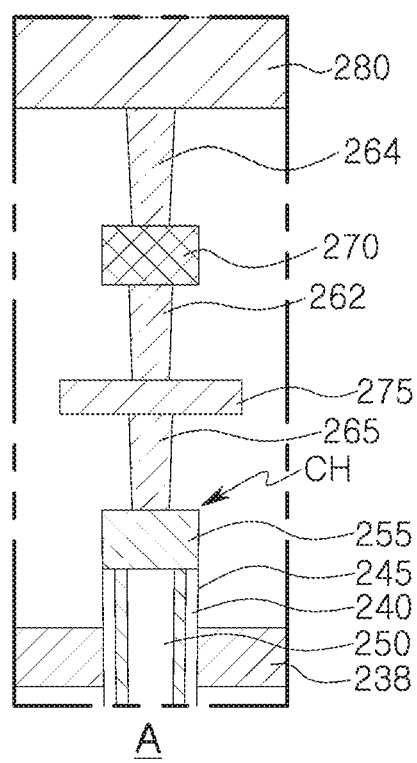

Referring to FIG. 6C, a wiring structure may include a fourth conductive plug 265, a first cell wiring line 275, a first conductive plug 262, a bit line 270, a second conductive plug 264, and a first bonding pad 280, sequentially stacked on an upper portion of the channel CH. In this example embodiment, a fourth conductive plug 265 and a first cell wiring line 275 may be further disposed between the channel CH and the first conductive plug 262. The first cell wiring line 275 may be a line disposed between the first conductive plug 262 and the fourth conductive plug 265. Thus, according to example embodiments, even when a channel CH in a lower portion and a first bonding pad 180 in an upper portion are not disposed to vertically overlap, the channel and the first bonding pad may be connected using the first cell wiring line 275. Moreover, the first cell wiring line 275 may be used for rewiring between the channel CH and the bit line 270.

Figure 6D:
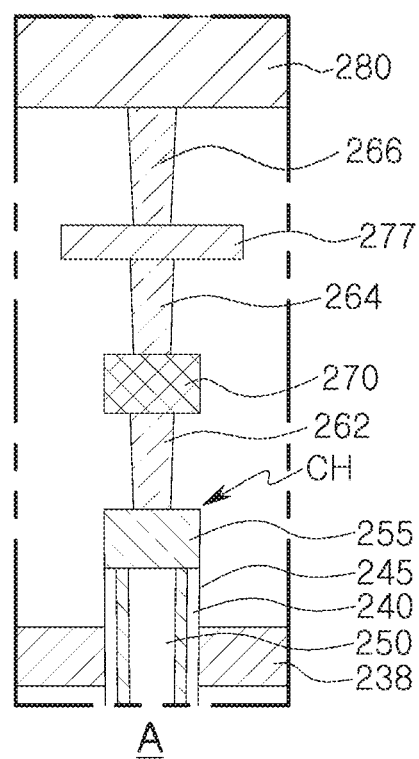

Referring to FIG. 6D, a wiring structure may include a first conductive plug 262, a bit line 270, a second conductive plug 264, a second cell wiring line 277, a fifth conductive plug 266, and a first bonding pad 280, sequentially stacked on an upper portion of the channel CH. In other words, in an example embodiment, the second cell wiring line 277 and the fifth conductive plug 266 may be further disposed between the second conductive plug 264 and the first bonding pad 280. In example embodiments, even when a channel CH in a lower portion and a first bonding pad 280 in an upper portion are not disposed in parallel in a vertical direction, the channel and the first bonding pad may be connected using the second cell wiring line 277.

As described above, a structure and form of the wiring structure, disposed on an upper portion of the channels CH, may be variously changed in example embodiments.

Figure 7:
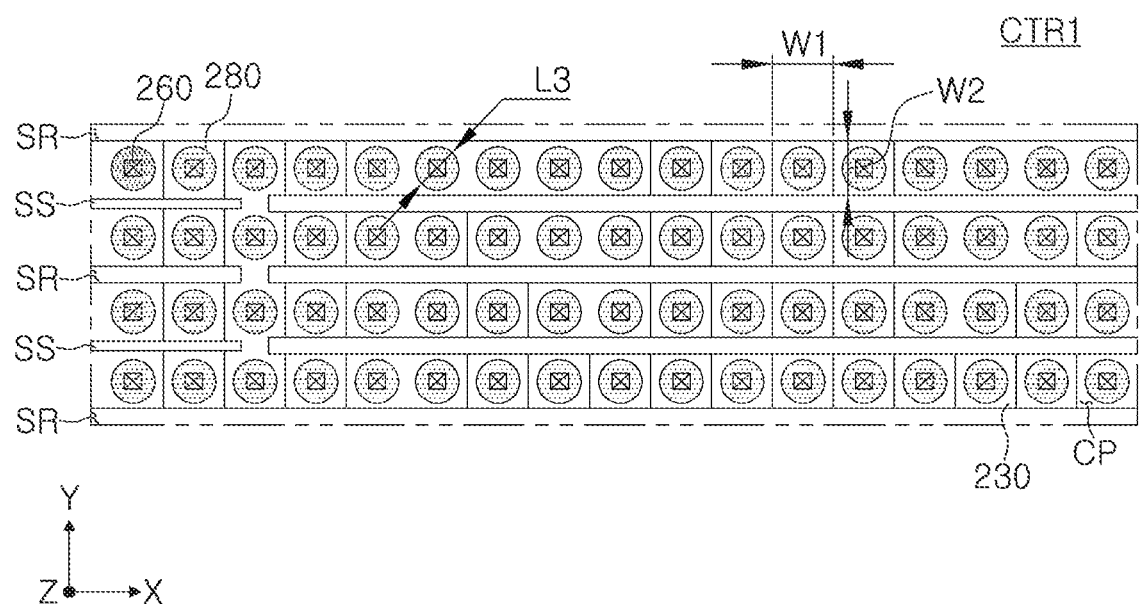
FIG. 7 is a layout diagram illustrating a portion of a semiconductor device according to example embodiments.

FIG. 7 is a layout diagram illustrating a portion of a semiconductor device according to example embodiments. FIG. 7 illustrates a layout of a main configuration in the cell connection region CTR of FIG. 3.

Referring to FIG. 7, in a cell connection region CTR1, arrangement on the plane, of the gate electrodes 230, the cell contact plugs 260, and the first connection pads 280 is illustrated.

The gate electrodes 230, as described with reference to FIG. 3, may have a form separated along the Y-direction in a certain region by the gate separation regions SR and the upper separation regions SS. In FIG. 7, a case in which the number of stacked gate electrodes 230 is large, as compared with example embodiments of FIGS. 3 and 4. The gate electrodes 230 are extended to different lengths in the X-direction to be stepped, and may also be stepped in the Y-direction. The illustrated region corresponds to a single memory block, but is not limited thereto. The contact regions CP corresponds to respective regions stepped in relation to adjacent regions, and different contact regions CP at adjacent vertical levels may have the same or different sizes (e.g., same or different lengths and/or widths from a plan view). Also, different contact regions CP at the same vertical level may have the same or different sizes (e.g., same or different lengths and/or widths from a plan view). A minimum width of each contact region CP may be a first width W1 in the X-direction or may be a second width W2 in the Y-direction, and the first width W1 and the second width W2 may be equal or different.

At least one of the cell contact plugs 260 may be disposed in each of the contact regions CP. At least one cell contact plug 260 may be connected to a single gate electrode 230. Each of the first cell contact plugs 260 may be continuously formed pillars extending between a first contact plug 262 and a corresponding gate electrode 230. At least some of the cell contact plugs 260, exceeding one per the gate electrode 230, may correspond to a dummy cell contact plug or arrangement thereof may be able to be omitted.

The first connection pads 280 are illustrated to have a circular shape on a plane, but they are not limited thereto, and may have various shapes such as quadrangular, elliptical shapes, and the like according to example embodiments. Pads, as described herein, are formed of conductive material and have a substantially flat, or planar, outer surface. A maximum length L3 of the first connection pads 280 may be less than the first width W1 and the second width W2 of each contact region CP, so that from a top-down view, each cell contact contact region CP surrounds at least one respective first connection pad 280. Thus, a pitch of the first connection pads 280 may be equal to or less than a pitch of the contact regions CP. In this case, as illustrated in the drawings, each of the first connection pads 280 may be disposed on the cell contact plug 260 in each contact region CP. Thus, the first connection pads 280 may be disposed to vertically overlap the cell contact plug 260 on an upper portion of the cell contact plug 260 connected thereto. In example embodiments, when a pitch of the first connection pads 280 is less than a pitch of the contact regions CP, all the first connection pads 280 may also be arranged on a region of the cell connection region CTR1, in which the gate electrodes 230 are disposed.

Figure 8A:
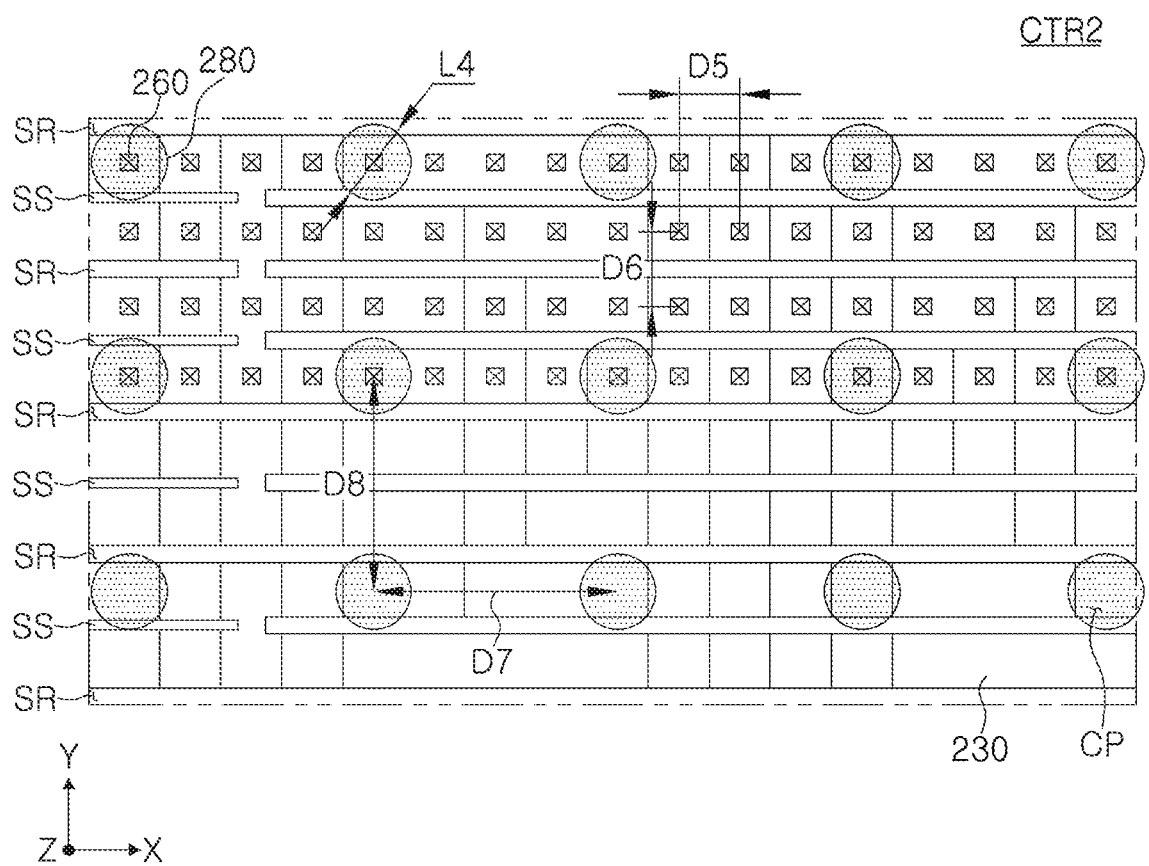
FIGS. 8A to 8C are layout diagrams illustrating a portion of a semiconductor device according to example embodiments.
Figure 8B:
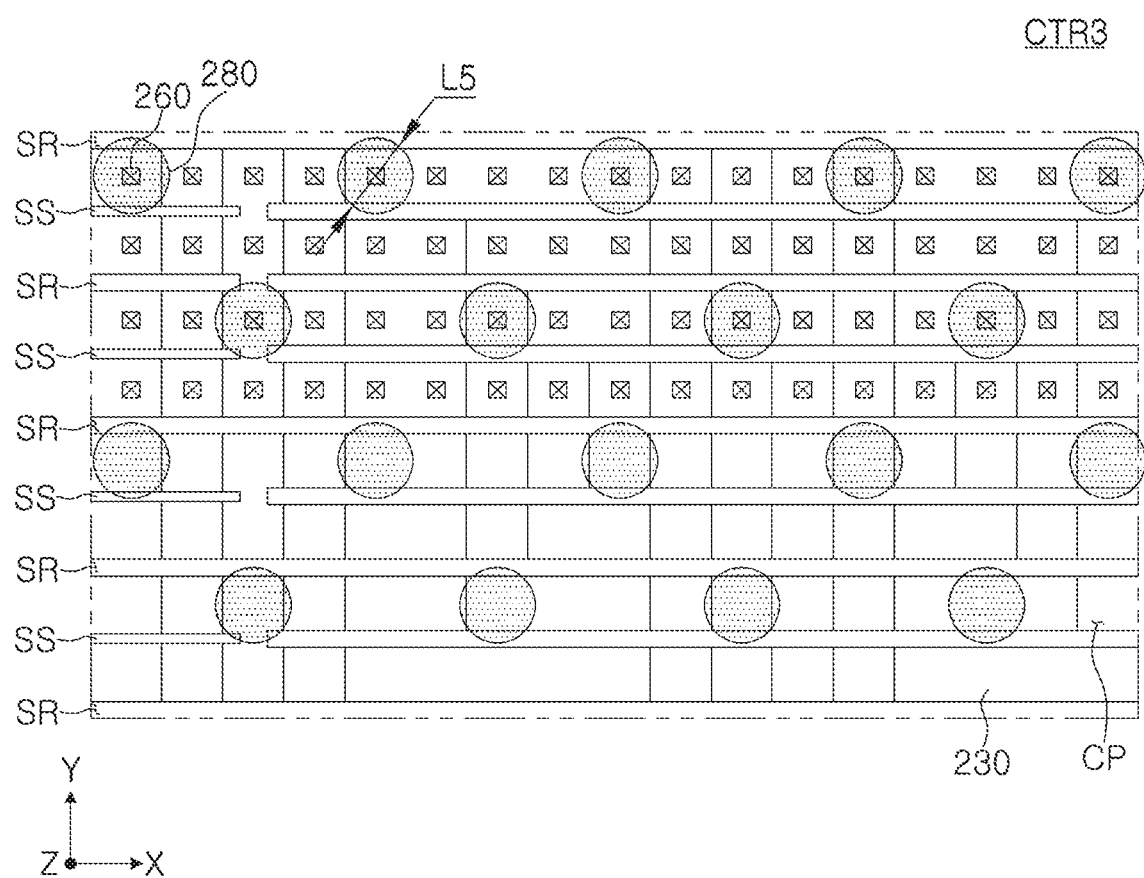
Figure 8C:
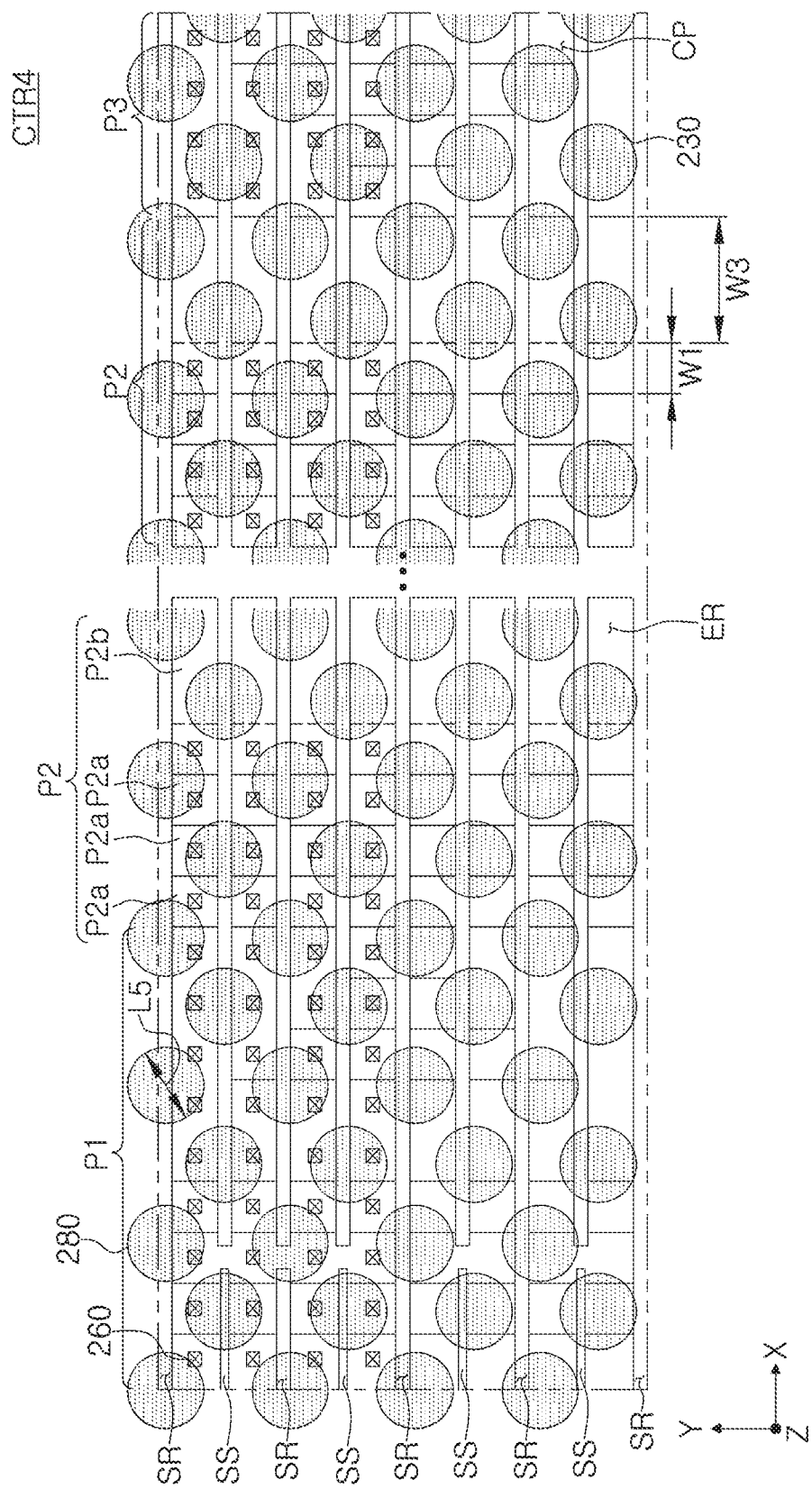

FIGS. 8A to 8C are layout diagrams illustrating a portion of a semiconductor device according to example embodiments. FIGS. 8A to 8C illustrate a layout of a main configuration in the cell connection region CTR of FIG. 3.

Referring to FIGS. 8A to 8C, in the cell connection region CTR, arrangement on the plane, of the gate electrodes 230, the cell contact plugs 260, and the first connection pads 280 is illustrated. In the cell connection regions CTR2, CTR3, and CTR4 of FIGS. 8A to 8C, in a manner different from FIG. 7, a layout is illustrated of a case in which at least one of a seventh pitch D7 and an eighth pitch D8 of the first connection pads 280 is greater than a fifth pitch D5 or a sixth pitch D6, pitches of some of the contact regions CP in the X-direction and the Y-direction, respectively.

Two memory blocks, adjacent to each other, are illustrated in FIGS. 8A to 8C. However, the form of gate electrodes 230 and the number of contact regions CP, determining a single memory block, may be changed variously in example embodiments. In two memory blocks adjacent to each other (e.g., in the Y-direction), cell contact plugs 260 are disposed in a first memory block in a first region (e.g., an upper portion of FIG. 8A), and cell contact plugs 260 are not disposed in a second memory block in a second region (e.g., lower portion of FIG. 8A). In this case, the second memory block in the second region may be connected to cell contact plugs 260 at another end in the X-direction. Thus, a first group of first connection pads 280 may be electrically connected to cell contact plugs 260 disposed in a first memory block in a first region at one end of the gate electrodes 230 in the X-direction, and a second group of first connection pads 280 may be electrically connected to cell contact plugs 260 disposed in a second memory block in a second region at an opposite end of the gate electrodes 230 in the X-direction.

In the cell connection region CTR2 of FIG. 8A, the first connection pads 280 may be arranged in rows and columns and in a constant pattern. In an example embodiment, a length L4 of the first connection pads 280 may be greater than a length L3 in an example embodiment of FIG. 7, but is not limited thereto.

In the cell connection region CTR3 of FIG. 8B, the first connection pads 280 may be arranged in a zigzag or hexagonal shape. In an example embodiment, a length L5 of the first connection pads 280 may be greater than a length L4 in an example embodiment of FIG. 8A, but is not limited thereto.

In the case of example embodiments of FIGS. 8A and 8B, when the number of cell contact plugs 260 to be connected is relatively large, the first connection pads 280 may be disposed to be extended outwardly of the cell connection regions CTR2 and CTR3. For example, at least a portion of the first connection pads 280 may be arranged in an outer region of the cell connection regions CTR2 and CTR3 in the X-direction.

In the cell connection region CTR4 of FIG. 8C, the first connection pads 280 may be arranged in a zigzag or hexagonal form. However, in the cell connection region CTR4 in an example embodiment, the form of the contact regions CP, provided by the gate electrodes 230, may be different from that in an example embodiment of FIG. 8B.

According to the stacking order, the gate electrodes 230 may form the first pad region P1, the second pad region P2, and the third pad region P3.

The second pad region P2 is only formed of gate electrodes 230 that form part of a memory cell, and the second pad region P2 may be disposed repeatedly a plurality of times, between the first pad region P1 and the third pad region P3 according to the number of gate electrodes 230. In the case of the first pad region P1 and the third pad region P3, dummy gate electrodes may be included according to example embodiments, the number of cell contact plugs 260 to be connected is small, and/or density of cell contact plugs 260 may be low, relatively. On the other hand, in the case of the second pad region P2, cell contact plugs 260 are used to be connected to respective contact regions CP, and the second pad region P2 may thus be a region in which density of the cell contact plugs 260 is relatively high.

The second pad region P2 may include first regions P2a in three columns and a second region P2b in one column, extended in the Y-direction. The first region P2a may be a region defined by a first area (e.g., rectangular area) in which a first group of contact regions CP is disposed along the Y-direction, and the second region P2b may be a region defined by a second area (e.g., rectangular) in which a second group of contact regions CP is disposed along the Y-direction. Therefore, each of the first region P2a and the second region P2b may denote contact regions CP formed in a column of a single memory block in the Y-direction. A width W3 of the second region P2b in the X-direction may be greater than a width W1 of a first region P2a. For example, a width W3 of the second region P2b may be about 2 to about 5 times greater than a width W1 of a first region P2a. The width W3 of the second region P2b in the X-direction may be greater than the length L5 of the first connection pad 280, and the width W1 of a first region P2a may be less than the length L5 of the first connection pad 280. The second region P2b may include an extension region ER, which has a width in the X-direction greater than a width W1 of a first region P2a, and in which cell contact plugs 260 are not disposed. As described above, a second region P2b is periodically disposed between sets of first regions P2a, so an area in which the first connection pads 280 are disposed may be secured.

In example embodiments, when a pitch of the first connection pads 280 is relatively large, at least a portion of the first regions P2a may not overlap the first connection pads 280. For example, at least portions of the various contact regions CP within the first regions P2a may not vertically overlap any first connection pads 280. However, even in this case, the second regions P2b may be disposed to overlap the first connection pads 280 in at least portions of each second region P2b. In example embodiments, the relative number of the first regions P2a and the second regions P2b, that is, a period in which the second region P2b is disposed or a ratio of the number of first regions P2a to second regions P2b may be varied, and may be determined in consideration of the number of cell contact plugs 260, a size of the first connection pads 280, a size of the contact regions CP, and the like. Moreover, in example embodiments, contact regions CP in one column including an extension region ER may be disposed, not only in the second pad region P2, but also in the first pad region P1 and the third pad region P3. Contact regions CP described herein may also be described as gate electrode pads, wherein each contact region CP, whether it has a length and width of one unit (e.g., forming a square shape in FIGS. 8A-8C) or whether it includes an extension region, forms a gate electrode pad, and thus may have a length, for example in the X-direction, of more than one unit (e.g., two, three, four, etc., units).

In the second pad region P2, a portion of the first connection pads 280 may be disposed on the first regions P2a, and a portion thereof may be disposed on the second region P2b in both sides or one side of the first regions P2a. The number of first connection pads 280 disposed on an upper portion of a single contact region CP in a first region P2a, may be less than the number of the first connection pads 280 disposed on an upper portion of a single contact region CP in the second region P2b. Here, "the number of the first connection pads 280" may refer to an average number of the first connection pads 280, disposed per contact region CP. For example, a density per contact region CP of the first connection pads 280 may be greater in the second region P2b, as compared with that in a first region P2a. In this regard, as described above, because the second region P2b has a relatively greater width. According to example embodiments, in a first region P2a and a second region P2b, the first connection pads 280 may be disposed at different densities per unit area, and a density on the second region P2b may be relatively greater.

As can be seen from above, contact regions CP can include a plurality of sets of a first group of contact regions (e.g., sets of the columns labeled P2a) and a plurality of sets of a second group of contact regions (e.g., sets of the column labeled P2*b*). Therefore, the contact regions CP can include multiple groupings of two different types of contact regions, each grouping of the same type having the same layout from a top down view. Groupings of the first type can be periodically disposed between groupings of the second type, from a top down view.

To summarize certain features, as can be seen from the examples of FIG. 7 and FIGS. 8A-8C. In FIG. 7, the size or pitch of a connection pad 280 may be smaller than the size or pitch of one unit of a word line connection pad. Therefore, each of the connection pads 280 can be disposed above a respective word line connection pad. FIGS. 8A through 8C depict cases in which the size or pitch of the connection pads 280 is larger than the size or pitch of a unit of the word line connection pad. In FIGS. 8A through 8C, the connection pads 280 can be disposed above the word line connection pads of an adjacent memory block. As one example, in this case, gate electrodes 230 of the adjacent block can be connected to contact plugs 260 at an opposite end of the gate electrodes 230 along the x-direction.

More specifically, In FIGS. 8A and 8B, two types of disposition patterns of the connection pads 280 for a memory block are shown. In these embodiments, some of the connection pads 280 may be arranged in an outer region of the cell connection region CTR2/CTR3, because the number of the connection pads 280 may need to be the same as the number of the word line connection pads. Therefore, the connection pads 280 are disposed beyond the cell connection region CTR2/CTR3 for example, outside of an area defined by the word line connection pads of the memory block.

In FIG. 8C, an elongated word line connection pad (P2*b* region) is used to dispose the connection pads 280 within the cell connection region CTR4. As shown in FIG. 8C, word line connection pads may have irregular patterns in an upper portion (P1) and a lower portion (P3) of a stack of the word line connection pads. However, word line connection pads may have regular pattern in the middle (P2) of the stack. Therefore, P1 in FIG. 8C may represent a first group of word line connection pads in a first word line connection pad region (or in a first section of connection region CTR), and P3 may represent a third group of word line connection pads in a third word line connection pad region (or in a third section of connection region CTR). P2 may represent a second group of word line connection pads in a second word line connection pad region (or in a second section of connection region CTR), and P2 may include a repeated pattern of word line connection pads between P1 and P3, according to the number of gate electrodes 230 included.

For example, in the second word line connection pad region (P2), the elongated region (P2*b*) can be part of a word line connection pad provided after every three word line connection pads in the X-direction that have a unit size (e.g., in regions P2*a*). So a repeated pattern may include a number of word line connection pads (e.g., 3) that have a unit size, followed by a word line connection pad that has a size greater than a unit size (e.g., a unit size plus an extension region ER). As a result, an area for disposition of all of the connection pads 280 can be secured by inserting the region P2*b*, and the connection pads 280 can be disposed regularly above the word line connection pads for the memory block.

In an example embodiment, the first connection pads 280 are not located directly over an upper portion of the cell contact plugs 260 connected thereto, and may be connected to the cell contact plugs 260 through a separate wiring line. This will be described below in more detail with reference to FIG. 9.

Figure 9:
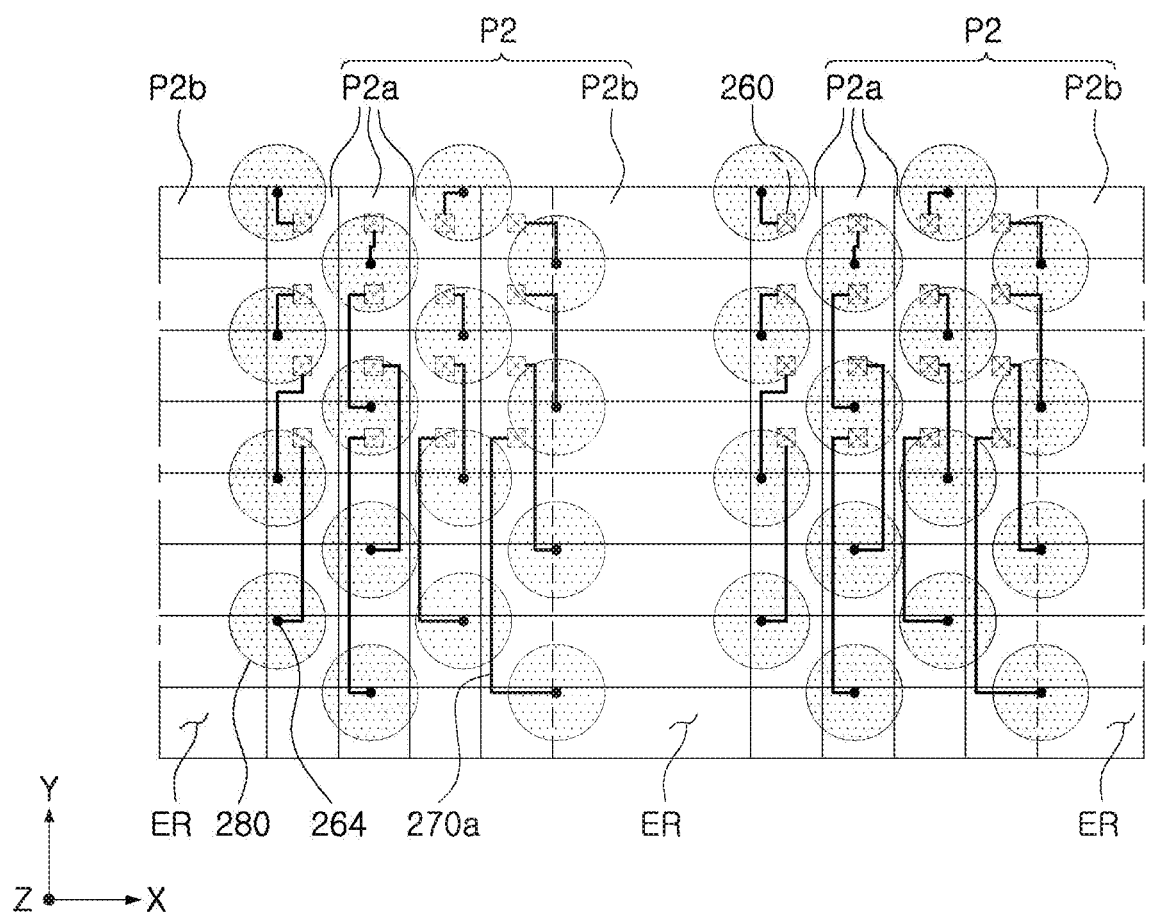
FIG. 9 is a layout diagram illustrating a portion of a semiconductor device according to example embodiments.

FIG. 9 is a layout diagram illustrating a portion of a semiconductor device according to example embodiments. FIG. 9 illustrates a layout of a main configuration in a portion of a cell connection region CTR4 of FIG. 8C.

Referring to FIG. 9, a second pad region P2 of the cell connection region CTR4 of FIG. 8C is enlarged and illustrated.

Each of first connection pads 280 may be disposed to vertically overlap the first region P2*a* connected thereto or the second region P2*b* connected thereto, and may be disposed not to overlap a first region P2*a* connected thereto or the second region P2*b* connected thereto. The first connection pads 280 may be connected to the cell contact plugs 260 through wiring lines 270*a*.

In detail, the cell contact plugs 260 are connected to the first conductive plugs 262, respectively, as illustrated in FIG. 4, and may be connected to the second conductive plugs 264, disposed to be spaced apart from each other in the X-direction and the Y-direction, by the wiring lines 270*a*, as illustrated in FIG. 9. Thus, the first conductive plugs 262 may be connected to the first connection pads 280 disposed on an upper portion of the second conductive plugs 264. In example embodiments, a wiring structure between the first connection pads 280 and the cell contact plugs 260 may be variously changed. A vertical structure of the wiring structure will be described below in more detail with reference to FIGS. 10A to 10C. A horizontal structure, for example, wiring lines 270*a* may be disposed in maximum three columns or three rows on a single first region P2*a*. In some embodiments a plurality of first regions P2*a* may be referred to as a set of first region P2*a*, and each column of the set of first regions P2*a* may be referred to as a first region. Thus, the wiring lines 270*a* may be disposed on a plane in various forms within the range described above.

The first connection pads 280 may be arranged to form different patterns by selecting the arrangement of the first connection pads 280 in the cell array regions CAR described above with reference to FIGS. 5A and 5B, and the arrangement of the first connection pads 280 in the cell connection regions CTR described above with reference to FIGS. 8A to 8C, one by one. However, according to example embodiments, the first connection pads 280 may be arranged to form one pattern as a whole while selecting the arrangements of the example embodiments in two regions one by one.

Figure 10A:
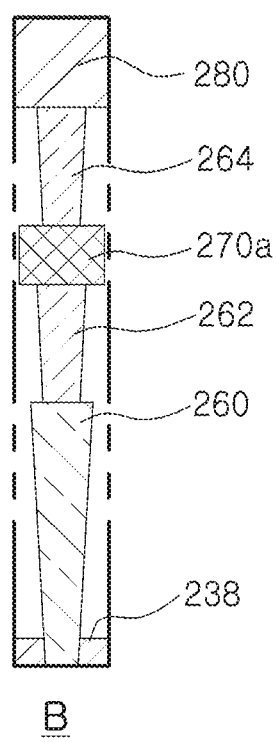
FIGS. 10A to 10C are schematic partially enlarged views illustrating a semiconductor device according to example embodiments.
Figure 10B:
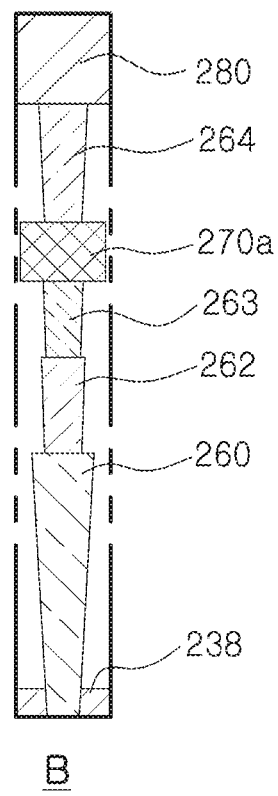
Figure 10C:
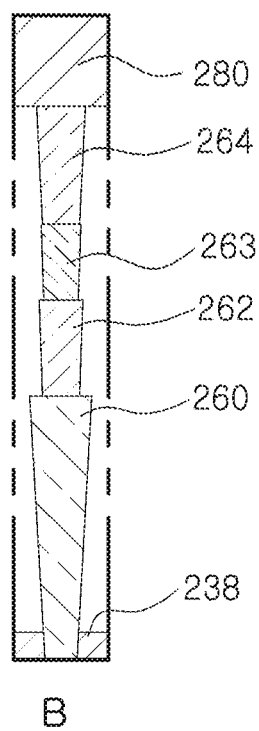

FIGS. 10A to 10C are schematic partially enlarged views illustrating a semiconductor device according to example embodiments. FIG. 10A illustrates an enlarged region B of FIG. 4, and FIGS. 10B and 10C illustrate an enlarged region corresponding to the region B of FIG. 4.

Referring to FIG. 10A, arrangement of wiring structures on an upper portion of the cell contact plug 260 is enlarged and illustrated. As described above with reference to FIG. 4, the first conductive plug 262, the wiring line 270*a*, the second conductive plug 264, and the first bonding pad 280 are sequentially disposed on an upper portion of the cell contact plug 260. The wiring line 270*a*, disposed in an upper portion of the cell contact plug 260, is not a layer serving as bit lines BL0 to BL2 as illustrated in FIG. 2 in a semiconductor device, but may be a layer serving as a wiring line for vertical connection.

Referring to FIG. 10B, a wiring structure may include a first conductive plug 262, a third conductive plug 263, a wiring line 270*a*, a second conductive plug 264, and a first bonding pad 280, sequentially stacked on an upper portion of the cell contact plug 260. In this an example embodiment, a third conductive plug 263 may be further disposed between the first conductive plug 262 and the wiring line 270a.

Referring to FIG. 10C, a wiring structure may include a first conductive plug 262, a third conductive plug 263, a second conductive plug 264, and a first bonding pad 280, sequentially stacked on an upper portion of the cell contact plug 260. In this example embodiment, a third conductive plug 263 may be further disposed between the first conductive plug 262 and the second conductive plug 264, and the wiring line 270a may not be disposed.

As described above, a structure and form of the wiring structure, disposed on an upper portion of the cell contact plug 260, may be variously changed in example embodiments.

Structures of a wiring structure on an upper portion of the channel CH described above with reference to FIGS. 6A to 6D may be applied to that on the cell contact plug 260, and example embodiments described above with reference to FIGS. 10A and 10B, including the wiring line 270a, may be applied to that in an upper portion of the channel CH. Moreover, in a single semiconductor device, structures of wiring structures disposed on an upper portion of the channel CH and an upper portion of the cell contact plug 260 are not necessarily the same, and different wiring structures may be provided thereon.

Figure 11:
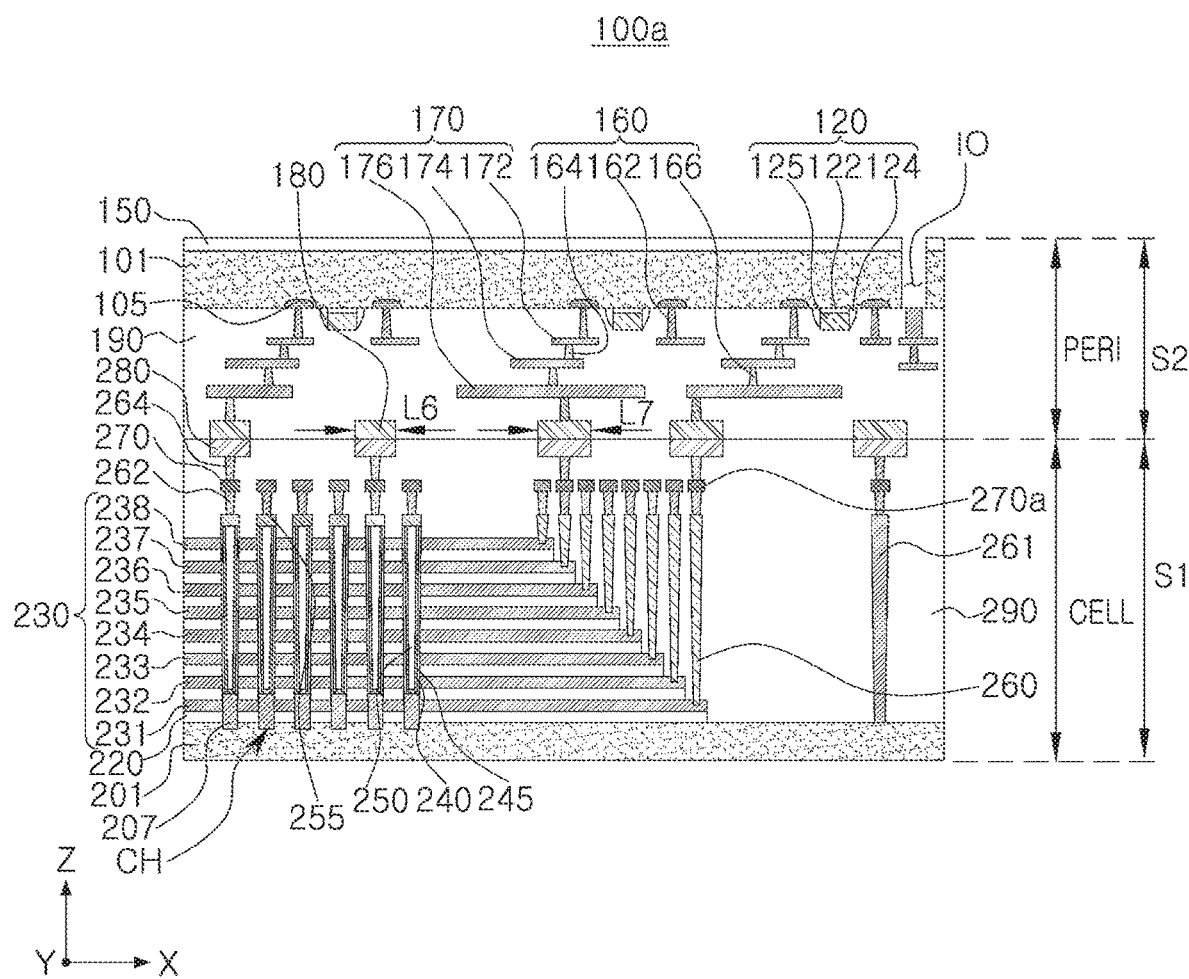
FIG. 11 is a schematic cross-sectional view illustrating a semiconductor device according to example embodiments.

FIG. 11 is a schematic cross-sectional view illustrating a semiconductor device according to example embodiments.

Referring to FIG. 11, in a semiconductor device 100a, the first bonding pads 280 and the second bonding pads 180 of the first substrate structure S1 and the second substrate structure S2 may have different sizes on an upper portion of the channel CH and on an upper portion of the cell contact plug 260. As such, the first bonding pads 280 and the second bonding pads 180 may have different sizes in regions corresponding to the cell array region CAR and the cell connection region CTR of FIG. 3.

The first bonding pads 280 and the second bonding pads 180 may have a sixth length L6 on an upper portion of the channel CH, and may have a seventh length L7 on an upper portion of the cell contact plug 260, greater than the sixth length L6. This embodiment may provide an arrangement considering a difference in number per unit area of the first bonding pads 280 and the second bonding pads 180, in the cell array region CAR and the cell connection region CTR. For example, when the number per unit area of the first bonding pads 280 and the second bonding pads 180 in the cell connection region CTR, is relatively small, the first bonding pads 280 and the second bonding pads 180 in the cell connection region CTR are formed relatively large, so areas of the first bonding pads 280 and the second bonding pads 180 per unit area, may be similarly controlled. According to example embodiments, bonding pads on an upper portion of the channel CH may be able to be formed relatively large.

Figure 12:
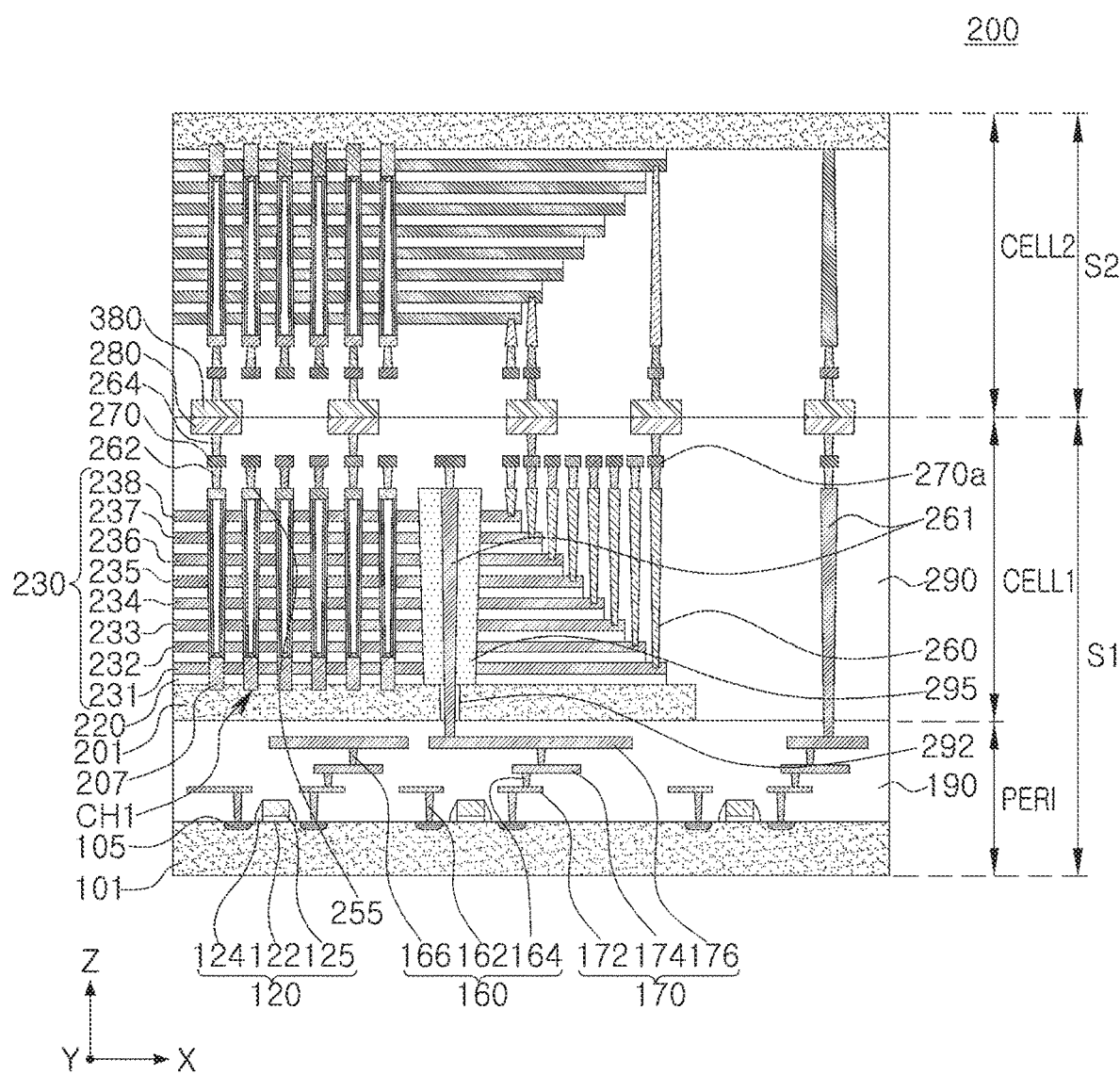
FIG. 12 is a schematic cross-sectional view illustrating a semiconductor device according to example embodiments.

FIG. 12 is a schematic cross-sectional view illustrating a semiconductor device according to example embodiments.

Referring to FIG. 12, the semiconductor device 200 may include a first substrate structure S1 and a second substrate structure S2, vertically stacked. The first substrate structure S1 may include all of a first memory cell region CELL1 and a peripheral circuit region PERI, in a manner different from the example embodiment of FIG. 4. The second substrate structure S2 may include an additional second memory cell region CELL2. Hereinafter, descriptions of the configuration of reference numerals the same as those of FIG. 4 are applied equally, and thus a duplicate description thereof will be omitted.

The first substrate structure S1 may have a structure in which the first memory cell region CELL1 is disposed on the peripheral circuit region PERI, and is thus electrically connected thereto. For the connection described above, the first substrate structure S1 may further include a through wiring insulating layer 295. The through wiring insulating layer 295 may be disposed to pass through the gate electrodes 230 and the interlayer insulating layers 220 from an upper portion of the gate electrodes 230. A cell contact plug 261 may be disposed in the through wiring insulating layer 295. A cell contact plug 261, passing through the through wiring insulating layer 295, may pass through the substrate 201 to be directly connected to circuit wiring lines 170 of the peripheral circuit region PERI. The cell contact plug 261, passing through the through wiring insulating layer 295, may be insulated from the substrate 201 by a side insulating layer 292.

The second memory cell region CELL2 may have a structure the same as or similar to that of the first memory cell region CELL1. For example, the arrangement of a wiring structure including the cell contact plugs 260 in the second memory cell region CELL2 may be different from that in the first memory cell region CELL1. The second memory cell region CELL2 may include second bonding pads 380. The second bonding pads 380 may be bonded to the first bonding pads 280 of the first substrate structure S1, thereby connecting the first substrate structure S1 to the second substrate structure S2. The first bonding pads 280 and the second bonding pads 380 may have the structure and arrangement, such as described above with reference to FIGS. 5A to 10C.

In the semiconductor device 200, the bit lines 270 of the first memory cell region CELL1 and the second memory cell region CELL2 may be electrically connected to each other by a wiring structure including the first bonding pads 280 and the second bonding pads 380. Moreover, at least a portion of the gate electrodes 230 of the first memory cell region CELL1 and the second memory cell region CELL2 may be electrically connected to each other by a wiring structure including the first bonding pads 280 and the second bonding pads 380.

Figure 13:
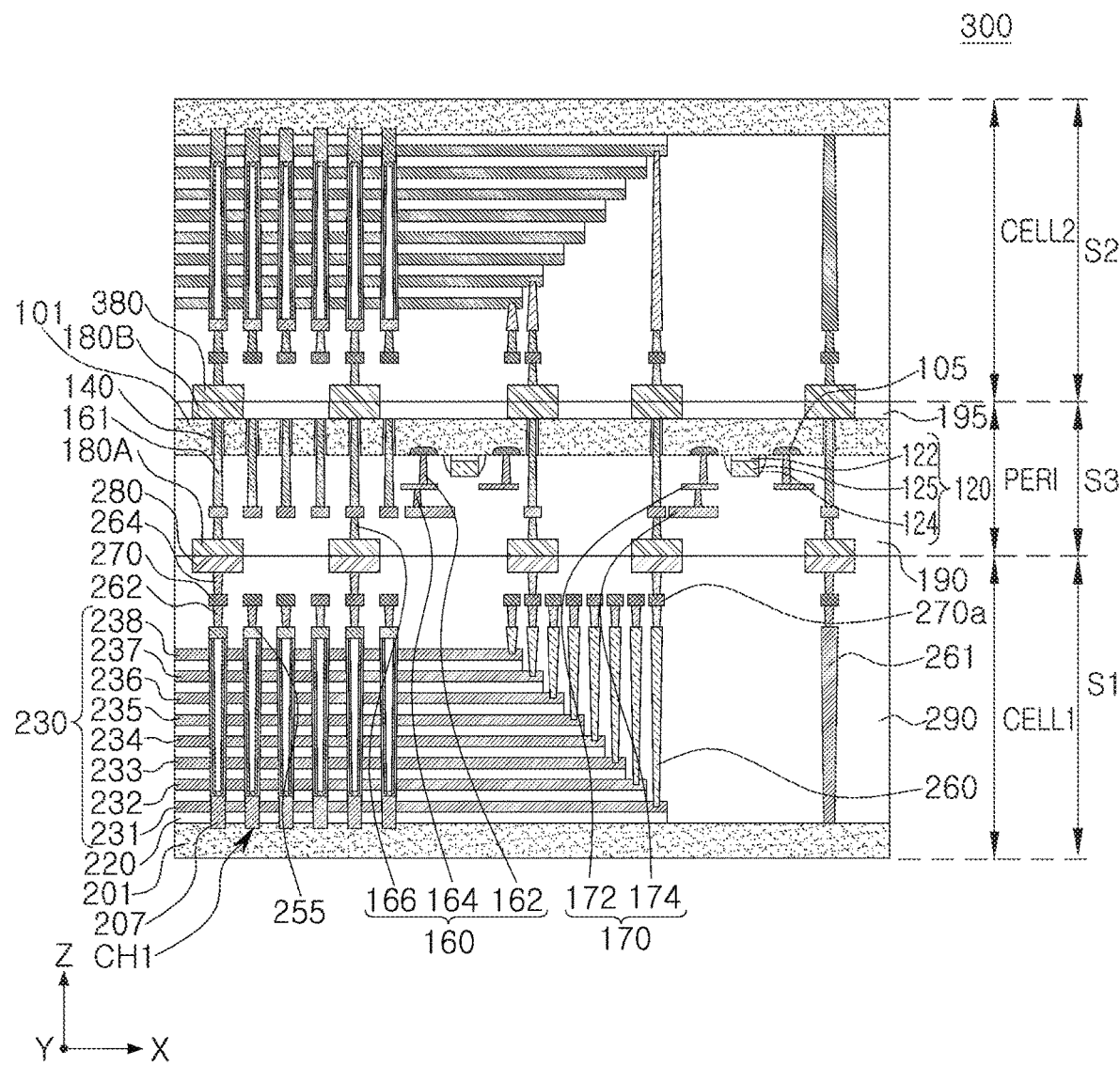
FIG. 13 is a schematic cross-sectional view illustrating a semiconductor device according to example embodiments.

FIG. 13 is a schematic cross-sectional view illustrating a semiconductor device according to example embodiments.

Referring to FIG. 13, the semiconductor device 300 may include a first substrate structure S1, a third substrate structure S3, and a second substrate structure S2, sequentially and vertically stacked. The first substrate structure S1 may include a first memory cell region CELL1, the third substrate structure S3 may include a peripheral circuit region PERI, and the second substrate structure S2 may include a second memory cell region CELL2. Hereinafter, descriptions overlapping those of FIGS. 4 and 12 will be omitted.

The peripheral circuit region PERI further includes circuit through contact plugs 161 passing through a base substrate 101, as well as third bonding pads 180A and fourth bonding pads 180B exposed to an upper surface and a lower surface through a first peripheral region insulating layer 190 and a second peripheral region insulating layer 195.

The circuit through contact plugs 161 may connect the third bonding pads 180A to the fourth bonding pads 180B, disposed on both surfaces of the base substrate 101, respectively. The circuit through contact plugs 161 may pass through the base substrate 101 and a portion of the first peripheral region insulating layers 190. The circuit through contact plugs 161 may be insulated from the base substrate 101 by a substrate insulating layer 140 disposed on a portion of a side surface.

The third bonding pads 180A and the fourth bonding pads 180B are disposed on both surfaces of the third substrate structure S3, respectively, and may be connected to each other through the circuit through contact plugs 161, the second circuit wiring lines 174, and the third circuit contact plugs 166. The fourth bonding pads 180B may be disposed to be in contact with an upper surface of the base substrate 101. The third bonding pads 180A may be bonded to the first bonding pads 280 of the first substrate structure S1, and the fourth bonding pads 180B may be bonded to the second bonding pads 380 of the second substrate structure S2. Thus, the third bonding pads 180A are electrically connected to the first bit lines 270 and the first cell contact plugs 260, and the fourth bonding pads 180B may be electrically connected to the second bit lines 370 and the second cell contact plugs 360. Thus, the first substrate structure S1, the second substrate structure S2, and the third substrate structure S3 may be electrically connected to each other through the third bonding pads 180A and the fourth bonding pads 180B. The first bonding pads 280, the second bonding pads 380, the third bonding pads 180A, and the fourth bonding pads 180B may have the structure and arrangement such as described above with reference to FIGS. 5A to 10C.

FIGS. 14A to 14H are schematic cross-sectional views illustrating a method for manufacturing a semiconductor device according to example embodiments. FIGS. 14A to 14H illustrate a region corresponding to FIG. 4.

Figure 14A:
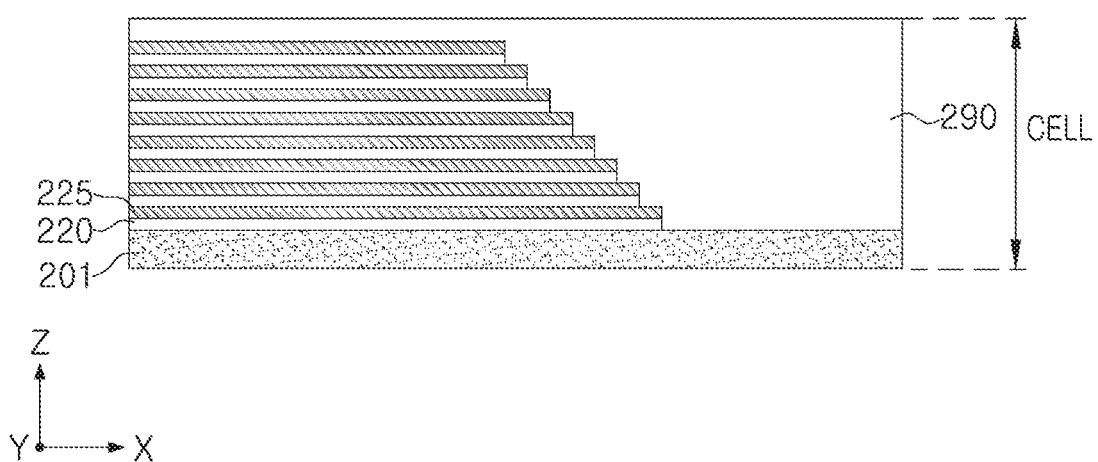
FIGS. 14A to 14H are schematic cross-sectional views illustrating a method of manufacturing a semiconductor device according to example embodiments.

Referring to FIG. 14A, for formation of the memory cell region CELL of the first substrate structure S1, sacrificial layers 225 and interlayer insulating layers 220 are alternately stacked on a substrate 201, and a portion of the sacrificial layers 225 and the interlayer insulating layers 220 may be removed to allow the sacrificial layers 225 to be extended in different lengths, for example to have a stepped staircase structure.

The substrate 201 may be a single crystal silicon wafer. The sacrificial layers 225 may be a layer to be replaced with gate electrodes 230 through a subsequent process. The sacrificial layers 225 may be formed of a material to be etched with etching selectivity with respect to the interlayer insulating layers 220. For example, the interlayer insulating layer 220 may include at least one of silicon oxide and silicon nitride, and the sacrificial layers 225 may include a material selected from silicon, silicon oxide, silicon carbide, and silicon nitride, different from that of the interlayer insulating layer 220. In example embodiments, all of thicknesses of the interlayer insulating layers 220 may be the same, but in other embodiments, the thicknesses of the different interlayer insulating layers 220 may not be the same.

Then, in order to allow sacrificial layers 225 in an upper portion of the layer stack to be extended shorter than sacrificial layers 225 in a lower portion, a photolithography process and an etching process for the sacrificial layers 225 and the interlayer insulating layers 220 may be repeatedly performed. Thus, the sacrificial layers 225 may have a stepped form. In example embodiments, sacrificial layers 225 may be formed to have a relatively thick thickness at an end portion (not shown in FIG. 14A), and a process therefor may be further performed. Then, a cell region insulating layer 290 covering an upper portion of a stacked structure of the sacrificial layers 225 and the interlayer insulating layers 220 may be provided.

Figure 14B:
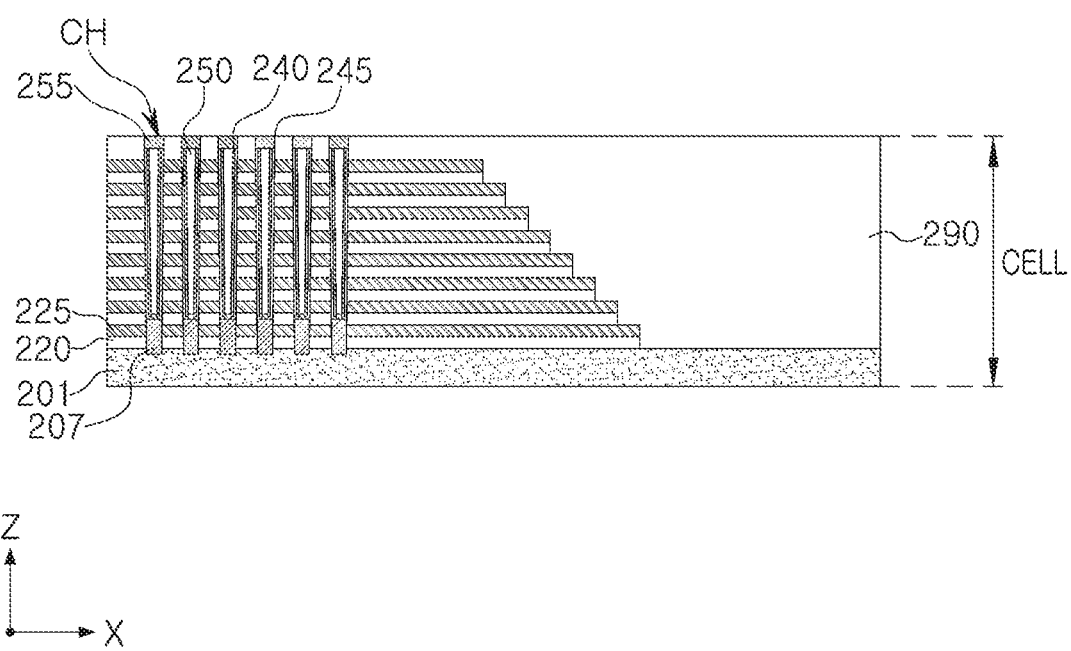

Referring to FIG. 14B, channels CH passing through a stacked structure of the sacrificial layers 225 and the interlayer insulating layers 220 may be provided.

For formation of the channels CH, first, the stacked structure may be anisotropically etched to form channel holes. Due to a height of the stacked structure, a side wall of the channel holes CH may not be perpendicular to an upper surface of the substrate 201. In example embodiments, the channel holes may be formed to recess a portion of the substrate 201.

Then, the epitaxial layer 207, the channel region 240, the gate dielectric layer 245, the channel insulating layer 250, and the channel pads 255 are formed in the channel holes, thereby forming channels CH. The epitaxial layer 207 may be formed using a selective epitaxial growth (SEG) process. The epitaxial layers 207 may include a single layer or a plurality of layers. The epitaxial layers 207 may contain polycrystalline silicon (Si), monocrystalline Si, polycrystalline germanium (Ge) or monocrystalline Ge that are doped with or do not include an impurity. The gate dielectric layer 245 may be formed to have a uniform thickness using ALD or CVD. In the operation described above, at least a portion, vertically extended along the channel region 240, of the gate dielectric layer 245, may be provided. The channel region 240 may be formed on the gate dielectric layer 245 in the channels CH. The insulating layer 250 may be formed to fill the channels CH, and may be an insulating material. However, according to example embodiments, rather than the channel insulating layer 250, a conductive material may fill a space of the channel region 240. The channel pads 255 may be formed of a conductive material, for example, polycrystalline silicon.

Figure 14C:
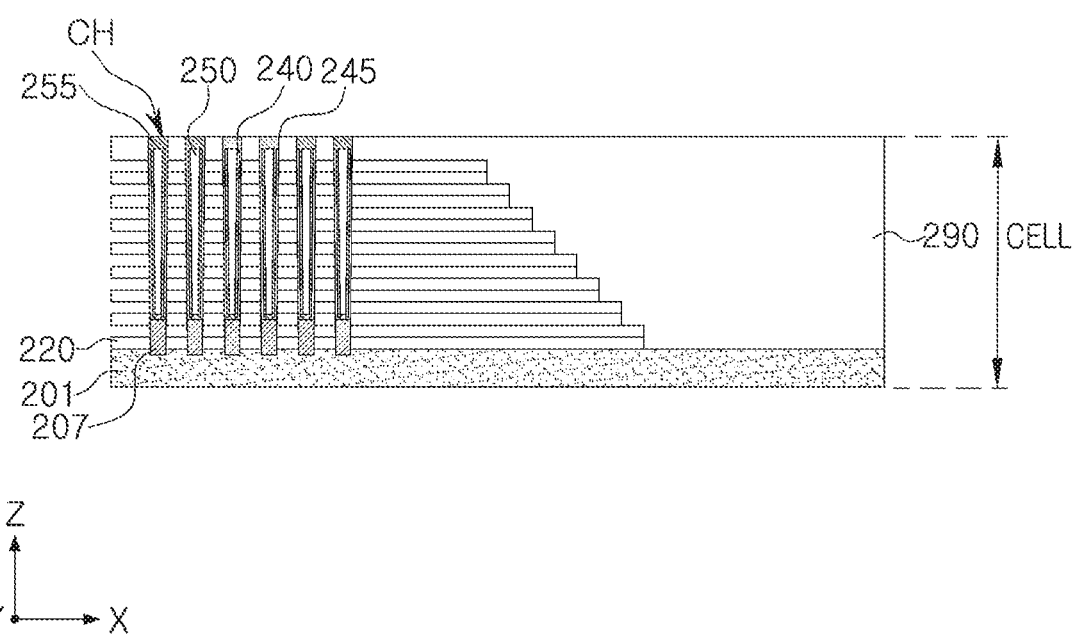

Referring to FIG. 14C, openings, passing through a stacked structure of the sacrificial layers 225 and the interlayer insulating layers 220, are provided, and the sacrificial layers 225 may be removed through the openings.

The openings may be provided in the form of a trench, extending in the X-direction in a region, not illustrated, along the gate separation regions SR of FIG. 3. The sacrificial layers 225 may be removed selectively with respect to the interlayer insulating layers 220, using, for example, wet etching. Thus, a portion of side walls of the channels CH may be exposed between the interlayer insulating layers 220.

Figure 14D:
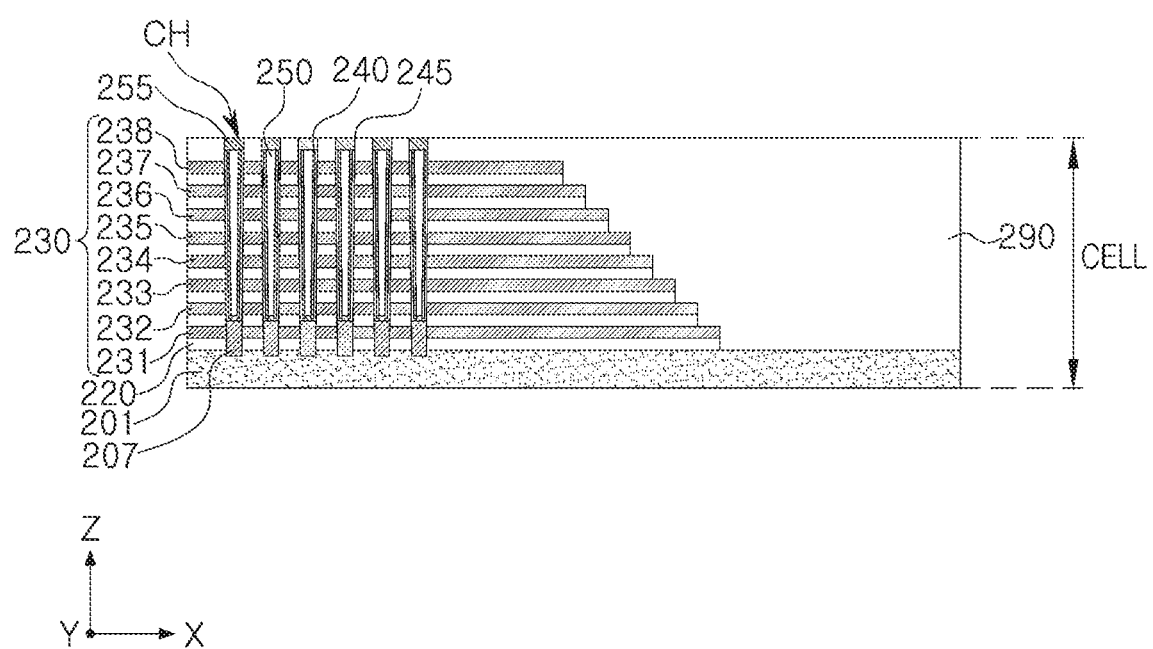

Referring to FIG. 14D, gate electrodes 230 are provided in a region from which the sacrificial layers 225 are removed.

A conductive material is embedded in the region, from which the sacrificial layers 225 are removed, to provide the gate electrodes 230. The gate electrodes 230 may contain metal, polycrystalline silicon or a metal silicide material. In example embodiments, before the gate electrodes 230 are provided, when a region, horizontally extended on the substrate 201 along the gate electrodes 230, of the gate dielectric layer 245, is provided, the region described above may be provided first.

Then, in a region not illustrated, a source conductive layer, serving as a common source line CSL of FIG. 2, may be provided in the openings. However, the source conductive layer is not necessarily formed in the openings, and may be formed in the substrate 201.

Figure 14E:
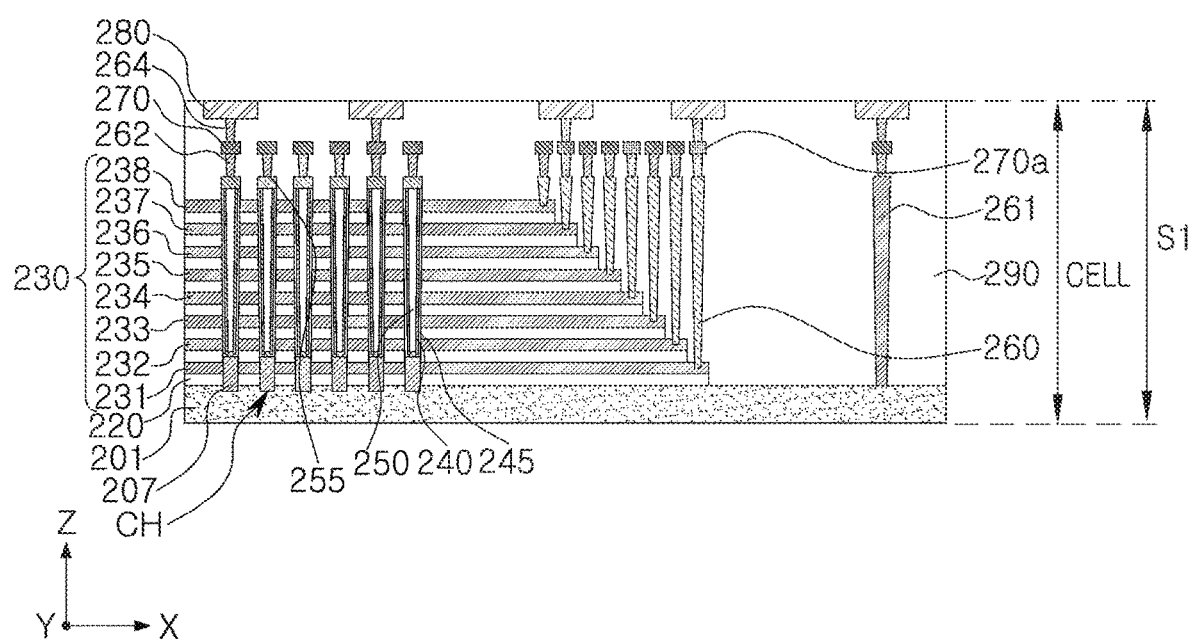

Referring to FIG. 14E, a wiring structure, which is the cell contact plugs 260, through contact plugs 261, first conductive plugs 262, bit lines 270 wiring lines 270a, second conductive plugs 264, and first bonding pads 280, are provided on the gate electrodes 230.

The cell contact plugs 260 and the through contact plug 261 may be formed by etching the cell region insulating layer 290 to form a contact hole, and embedding a conductive material, on each of the contact regions CP and the substrate 201. The first conductive plugs 262 may be formed by etching the cell region insulating layer 290 and depositing a conductive material on the channel pads 255, the cell contact plugs 260, and the through contact plug 261.

The bit lines 270 and wiring lines 270a may be formed through deposition and patterning processes of a conductive material, or by forming a single layer, an insulating layer forming the cell region insulating layer 290, and then patterning it and depositing a conductive material. The second conductive plugs 264 may be formed by etching the cell region insulating layer 290 and depositing a conductive material on the bit lines 270 and wiring lines 270a.

The first bonding pads 280 may be formed through, for example, a deposition and patterning processes of a conductive material on the second conductive plugs 264. An upper surface of the first bonding pads 280 may be exposed through the cell region insulating layer 290, and the first bonding pads may form a portion of an upper surface of the first substrate structure S1. According to example embodiments, the upper surface of the first bonding pads 280 may be provided in the form further protruding upwardly, as compared with an upper surface of the cell region insulating layer 290. Due to the operation described above, a memory cell region CELL is completed, and the first substrate structure S1 may be ultimately prepared.

Figure 14F:
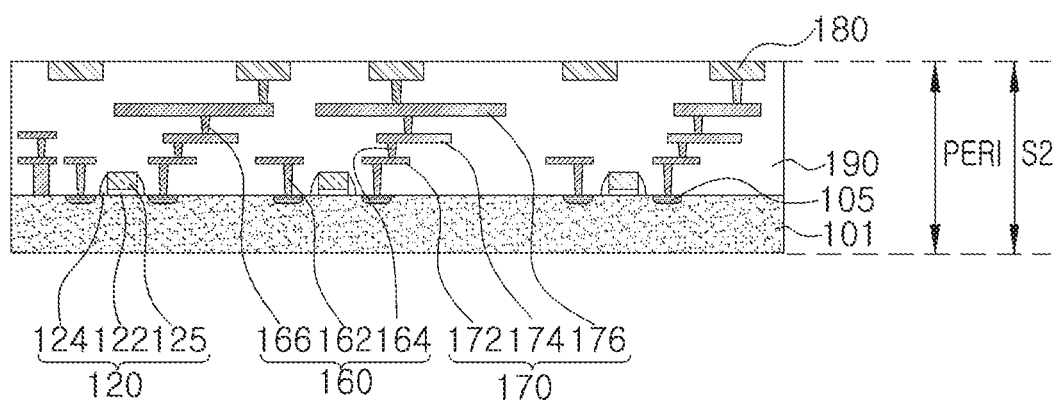

Referring to FIG. 14F, for formation of the second substrate structure S2, circuit elements 120 and circuit wiring structures are formed on the base substrate 101, thereby forming a peripheral circuit region PERI.

First, a circuit gate dielectric layer 122 and a circuit gate electrode 125 may be sequentially formed on the base substrate 101. The circuit gate dielectric layer 122 and the circuit gate electrode 125 may be formed using atomic layer deposition (ALD) or chemical vapor deposition (CVD). The circuit gate dielectric layer 122 may be formed of silicon oxide, and the circuit gate electrode layer 125 may be formed of at least one of polycrystalline silicon or metal silicide, but an example embodiment is not limited thereto. Then, the spacer layer 124 and the source/drain regions 105 may be formed on both side walls of the circuit gate dielectric layer 122 and the circuit gate electrode 125. According to example embodiments, the spacer layer 124 may be formed of a plurality of layers. Then, the source/drain regions 105 may be formed by performing an ion implantation process.

The circuit contact plugs 160 of the circuit wiring structures may be provided by forming a portion of the peripheral region insulating layer 190, etching and removing a portion and embedding a conductive material. The circuit wiring lines 170 may be provided by depositing and patterning a conductive material, by way of example.

The peripheral region insulating layer 190 may be formed of a plurality of insulating layers. The peripheral region insulating layer 190 may be ultimately provided to cover the circuit elements 120 and the circuit wiring structures, by forming a portion in respective operations for formation of the circuit wiring structures and forming a portion in an upper portion of the third circuit wiring line 176.

Figure 14G:
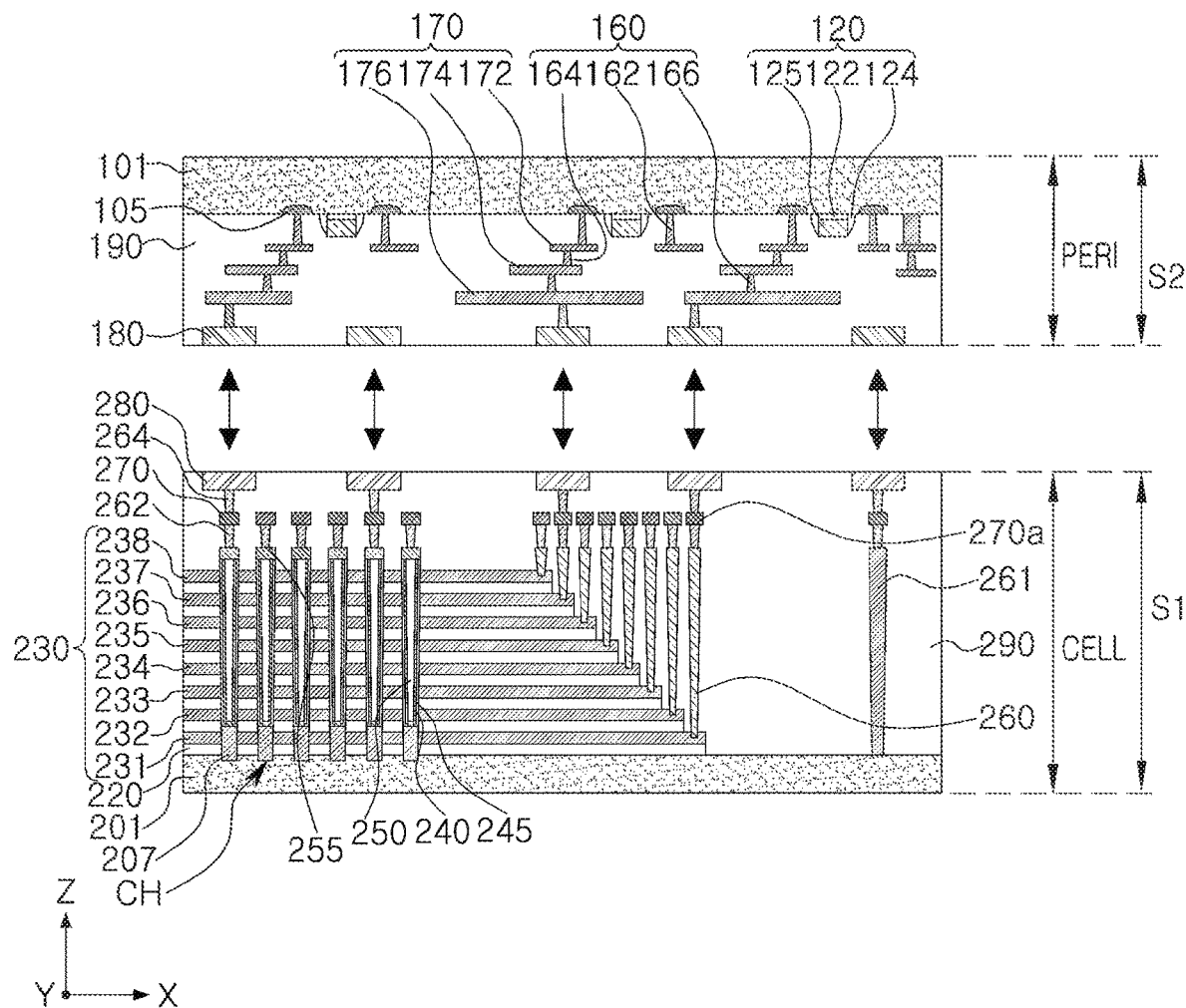

Referring to FIG. 14G, the second substrate structure S2 is bonded to the first substrate structure S1.

For example, the first substrate structure S1 and the second substrate structure S2 may be connected to each other by bonding the first bonding pads 280 and the second bonding pads 180 by applying pressure. The second substrate structure S2 may be bonded to the first substrate structure S1 by inverting the second substrate structure to allow the second bonding pads 180 to face downwardly. The first substrate structure S1 and the second substrate structure S2 may be directly bonded without intervention of an adhesive such as a separate adhesive layer. For example, bonding of the first bonding pads 280 and the second bonding pads 180 at an atomic level may be provided by applying a pressure as described above. In this manner, the first bonding pads 280 and the second bonding pads 180 contact each other. According to example embodiments, before bonding, in order to enhance bonding force, a surface treatment process such as a hydrogen plasma treatment may be further performed on an upper surface of the first substrate structure S1 and a lower surface of the second substrate structure S2.

In example embodiments, when the cell region insulating layer 290 includes the bonding dielectric layer described above in an upper portion and the second substrate structure S2 also has the same layer, a bonding force may be further secured due to not only bonding between the first bonding pads 280 and the second bonding pads 180, but also dielectric bonding between the bonding dielectric layers.

Figure 14H:
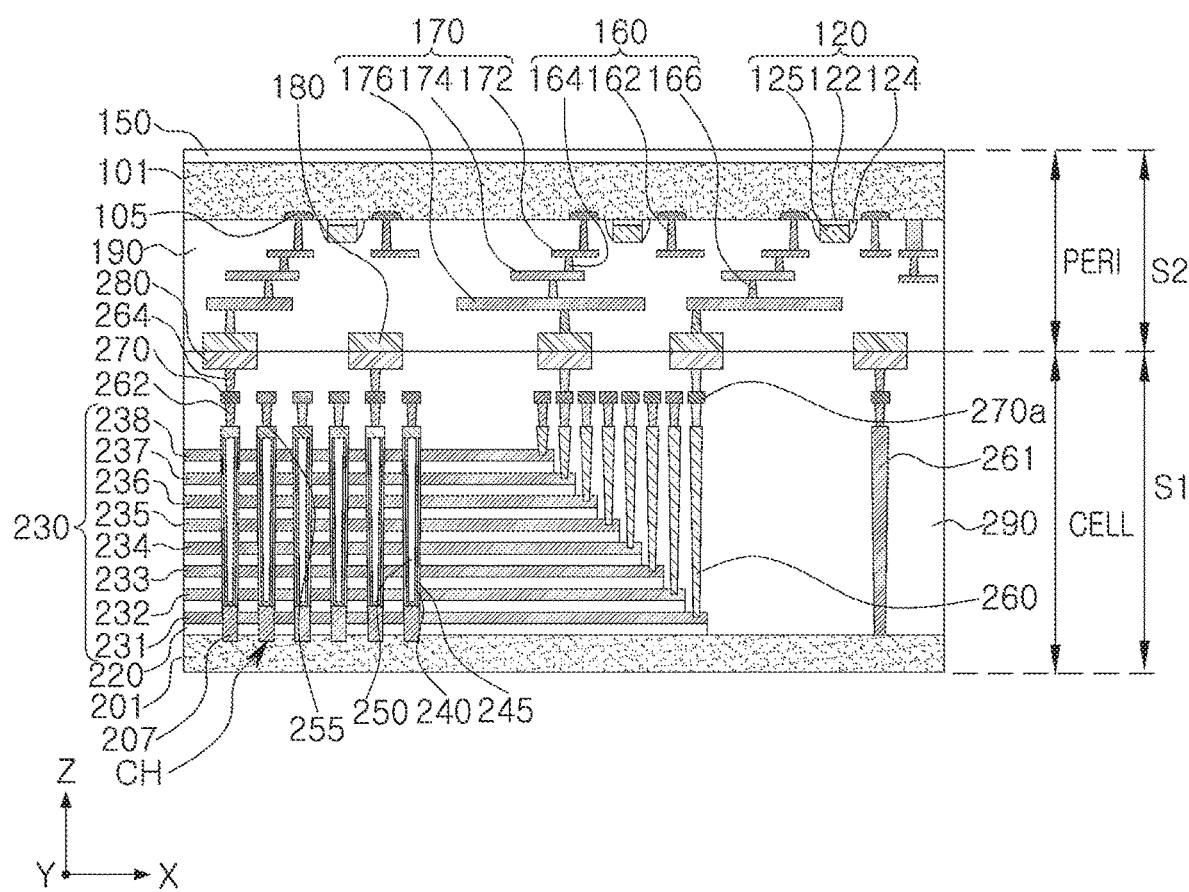

Referring to FIG. 14H, a passivation layer 150 may be formed on the base substrate 101 of the second substrate structure S2.

The passivation layer 150 may be formed through a deposition process on the base substrate 101 exposed upwardly by the bonding process.

Then, as illustrated in FIG. 5, the passivation layer 150 and the base substrate 101 are removed from some regions, thereby exposing a wiring structure in a lower portion to provide a pad region IO. Thus, the semiconductor device 100 of FIG. 5 may be ultimately manufactured. Each set of plugs or wiring lines described herein and shown in the figures to be at the same vertical level may be formed in a single process for forming the structures at that vertical level.

Figure 15:
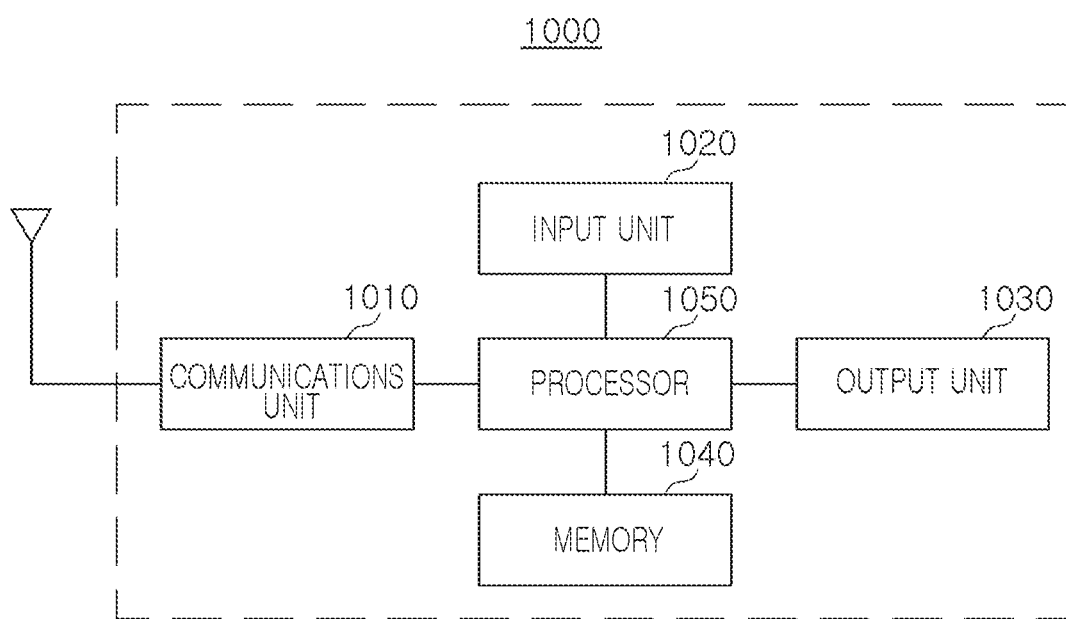
FIG. 15 is a block diagram illustrating an electronic device including a semiconductor device according to example embodiments.

FIG. 15 is a block diagram illustrating an electronic device including a semiconductor device according to example embodiments.

Referring to FIG. 15, an electronic device 1000 according to an example embodiment may include a communications unit 1010, an input unit 1020, an output unit 1030, a memory 1040, and a processor 1050.

The communications unit 1010 may include a wired/wireless communications module such as a wireless Internet module, a local communications module, a global positioning system (GPS) module, or a mobile communications module. The wired/wireless communications module included in the communications unit 1010 may be connected to an external communications network based on various communications standards to transmit and receive data. The input unit 1020 may include a mechanical switch, a touchscreen, a voice recognition module, and the like, as a module provided for a user to control operations of the electronic device 1000, and may further include various sensor modules to which a user may input data. The output unit 1030 may output information processed by the electronic device 1000 in an audio or video format, and the memory 1040 may store a program for processing or control of the processor 1050, or data. The memory 1040 may include one or more semiconductor devices according to various example embodiments as described above with reference to FIGS. 2 to 13, and may be embedded in the electronic device 1000 or may communicate with the processor 1050 through a separate interface. The processor 1050 may control operations of each component included in the electronic device 1000. The processor 1050 may perform control and processing associated with a voice call, a video call, data communications, and the like, or may conduct control and processing for multimedia reproduction and management. Moreover, the processor 1050 may process the input from a user via the input unit 1020 and output the result thereof through the output unit 1030, and may store data, required for controlling an operation of the electronic device 1000, in the memory 1040 or retrieve the data from the memory 1040.

As set forth above, according to example embodiments of the present inventive concept, arrangement of bonding pads is optimized in a structure in which two or more substrate structures are bonded, so a semiconductor device having improved reliability may be provided.

While example embodiments have been shown and described above, it will be apparent to those skilled in the art that modifications and variations could be made without departing from the scope of the present disclosure, as defined by the appended claims.

What is claimed is:

1. A semiconductor device, comprising:
a first substrate structure including a first substrate having a cell array region and a connection region, first gate electrodes stacked and separated from each other in a first direction, perpendicular to a surface of the first substrate, in the cell array region and extending by different lengths in a second direction, parallel to the surface of the first substrate, in the connection region to provide contact regions, first channels passing through the first gate electrodes and extending in the first direction in the cell array region, bit lines electrically connected to the first channels, and first bonding pads, each disposed to be electrically connected to a respective bit line; and
a second substrate structure, connected to the first substrate structure on the first substrate structure, and including a second substrate, circuit elements disposed on the second substrate and electrically connected to the first gate electrodes, and second bonding pads disposed on the circuit elements to correspond to the first bonding pads and bonded to the first bonding pads,
wherein each of the first bonding pads has a first length along the second direction in the cell array region and each of the second bonding pads has a second length greater than the first length along the second direction in the connection region.

2. The semiconductor device of claim 1, wherein the first bonding pads are arranged in different patterns in the cell array region and the connection region.

3. The semiconductor device of claim 1, wherein the first substrate structure further includes at least one conductive plug and at least one wiring line, disposed between each of the bit lines and a respective first bonding pads.

4. The semiconductor device of claim 1, wherein the first bonding pads and the second bonding pads include at least one of tungsten (W), aluminum (Al), copper (Cu), a tungsten nitride (WN), a tantalum nitride (TaN), or a titanium nitride (TiN).

5. The semiconductor device of claim 1, wherein the first substrate has a first thickness and the second substrate has a second thickness greater than the first thickness.

6. The semiconductor device of claim 1, wherein the second substrate structure further includes a passivation layer on a surface of the second substrate in which the circuit elements are not disposed.

7. The semiconductor device of claim 6, wherein the semiconductor device has a pad region in which the passivation layer and the second substrate are removed.

8. The semiconductor device of claim 7, wherein the second substrate structure further includes a wiring structure electrically connected to the circuit elements, and a portion of the wiring structure is exposed in the pad region.

9. The semiconductor device of claim 1, wherein the second substrate structure further includes a memory cell region disposed between the circuit elements and the second bonding pads, and
the memory cell region includes second gate electrodes stacked and separated from each other in the first direction and second channels passing through the second gate electrodes and extending in the first direction in the cell array region.

10. The semiconductor device of claim 9, wherein the memory cell region further includes a third substrate between the circuit elements and the second gate electrodes.

11. A semiconductor device, comprising:
a first substrate structure including a first substrate having a cell array region and a connection region, first gate electrodes stacked and separated from each other in a first direction, perpendicular to a surface of the first substrate, in the cell array region and extending by different lengths in a second direction, parallel to the surface of the first substrate, in the connection region to provide contact regions, first channels passing through the first gate electrodes and extending in the first direction in the cell array region, bit lines electrically connected to the first channels, cell contact plugs extending in the first direction and connected to the first gate electrodes in the contact regions, and first bonding pads, each disposed to be electrically connected to a respective bit line or a respective cell contact plug; and
a second substrate structure, connected to the first substrate structure on the first substrate structure, and including a second substrate, circuit elements disposed on the second substrate and electrically connected to the first gate electrodes, and second bonding pads disposed on the circuit elements to correspond to the first bonding pads and bonded to the first bonding pads,
wherein the first substrate structure further includes at least one first conductive plug and at least one first wiring line, disposed between each of the bit lines and a respective first bonding pad.

12. The semiconductor device of claim 11, wherein the first substrate structure further includes at least one second conductive plug and at least one second wiring line, disposed between each of the cell contact plugs and a respective first bonding pad.

13. The semiconductor device of claim 12, wherein the at least one second wiring line includes a second wiring layer disposed at a level the same as a level of the bit lines.

14. The semiconductor device of claim 11, wherein the first substrate structure further includes a plurality of second conductive plugs, stacked and disposed between respective cell contact plugs and first bonding pads.

15. The semiconductor device of claim 11, wherein the semiconductor device has a pad region in which the second substrate is removed.

16. The semiconductor device of claim 11, wherein the semiconductor device further includes memory cell region disposed between the circuit elements and the first gate electrodes, and the memory cell region includes second gate electrodes stacked and separated from each other in the first direction and second channels passing through the second gate electrodes and extending in the first direction in the cell array region.

17. The semiconductor device of claim 11, wherein the first substrate structure further includes a through contact plug connected to the first substrate and electrically connected to one of the first bonding pads.

18. A semiconductor device, comprising:

a first substrate structure including a first substrate having a cell array region and a connection region, gate electrodes stacked and separated from each other in a first direction, perpendicular to a surface of the first substrate, in the cell array region and extending by different lengths in a second direction, parallel to the surface of the first substrate, in the connection region to provide contact regions, channels passing through the gate electrodes and extending in the first direction in the cell array region, epitaxial layers disposed on the first substrate at lower ends of the channels, bit lines electrically connected to the channels, cell contact plugs extending in the first direction and connected to the gate electrodes in the contact regions, first bonding pads, each disposed to be electrically connected to a respective bit line or a respective cell contact plug, and a first bonding dielectric layer surrounding the first bonding pads; and a second substrate structure, connected to the first substrate structure on the first substrate structure, and including a second substrate, circuit elements disposed on the second substrate and electrically connected to the gate electrodes, second bonding pads disposed on the circuit elements to correspond to the first bonding pads and bonded to the first bonding pads, and a second bonding dielectric layer surrounding the second bonding pads and bonded to the first bonding dielectric layer, wherein portions of the first bonding pads and the second bonding pads have different sizes.

19. The semiconductor device of claim 18, wherein the first bonding dielectric layer and the second bonding dielectric layer includes at least one of SiO, SiN, SiCN, SiOC, SiON, or SiOCN.

20. The semiconductor device of claim 18, wherein each of the first bonding pads has a first length along the second direction in the cell array region and each of the second bonding pads has a second length greater than the first length along the second direction in the connection region.

* * * * *